United States Patent [19]
Miyai et al.

[11] Patent Number: 5,825,470
[45] Date of Patent: Oct. 20, 1998

[54] EXPOSURE APPARATUS

[75] Inventors: Tsuneo Miyai, Tokyo; Yuji Imai, Omiya, both of Japan

[73] Assignee: Nikon Corporation, Tokyo, Japan

[21] Appl. No.: 614,057

[22] Filed: Mar. 12, 1996

[30]   Foreign Application Priority Data

| Mar. 14, 1995 | [JP] | Japan | ................................ 7-81826 |
| May 26, 1995 | [JP] | Japan | ................................ 7-152221 |
| Jun. 2, 1995 | [JP] | Japan | ................................ 7-160061 |

[51] Int. Cl.⁶ .......................... G03B 27/58; G03B 27/42; B65B 21/02
[52] U.S. Cl. ................................ 355/72; 355/53; 414/416
[58] Field of Search .............................. 414/416; 355/53, 355/67, 77, 55

[56]   References Cited

U.S. PATENT DOCUMENTS

| 4,775,877 | 10/1988 | Kosugi et al. | ............................. 355/53 |
| 4,923,054 | 5/1990 | Ohtani et al. | .............................. 187/25 |
| 5,100,502 | 3/1992 | Murdoch et al. | ....................... 156/643 |
| 5,301,700 | 4/1994 | Kamikawa et al. | ...................... 134/76 |
| 5,404,894 | 4/1995 | Shiraiwa | ................................ 134/66 |
| 5,664,254 | 9/1997 | Ohkura et al. | .......................... 396/612 |
| 5,677,758 | 10/1997 | McEachern et al. | ...................... 355/75 |

FOREIGN PATENT DOCUMENTS

| 5-82411 | 4/1993 | Japan . |
| 7-66114 | 3/1995 | Japan . |

*Primary Examiner*—Arthur T. Grimley
*Assistant Examiner*—Shival Virmanl
*Attorney, Agent, or Firm*—Oliff & Berridge, PLC

[57]   ABSTRACT

Disclosed is an exposure apparatus comprising a substrate holder washing unit and a substrate holder storing unit. While a substrate holder exported from an exposure stage is washed in the washing unit, a clean holder previously stored in the storing unit is transported to an X stage by using a robot hand and a transport arm, and it is installed to the X stage by using an attaching/detaching mechanism. The holder can be always maintained in a clean state without stopping the apparatus for a long period of time, resulting in improvement in throughput. Also disclosed is an exposure apparatus comprising a mechanism for cleaning a substrate holder by transporting a whetstone onto the holder, engaging the whetstone with an engaging member, and rotating the whetstone by using a rotary driving unit. The exposure apparatus is provided with a unit for drawing dust emerged upon cleaning with the whetstone.

24 Claims, 27 Drawing Sheets

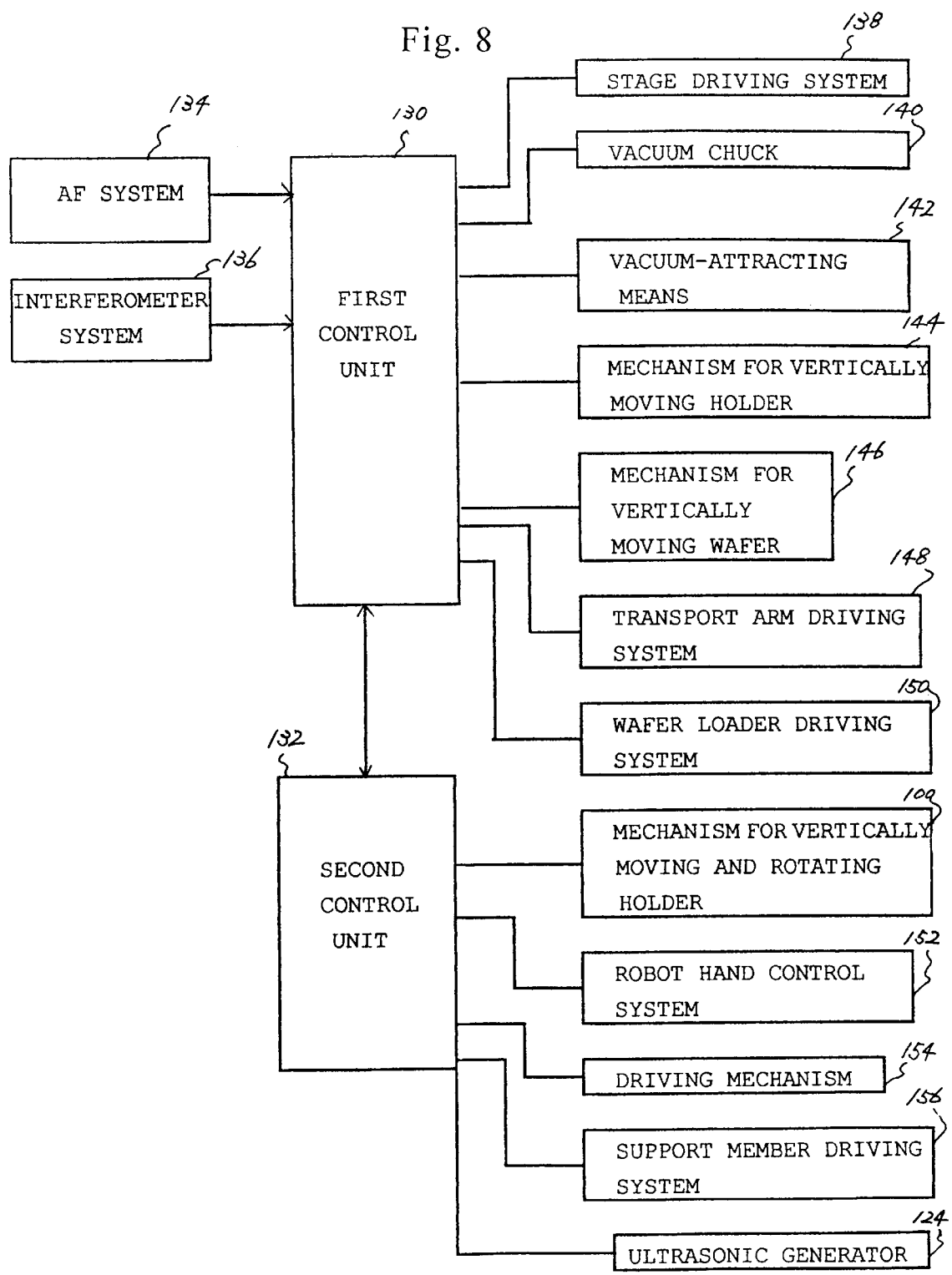

EXPOSURE APPARATUS

FIELD OF THE INVENTION

The present invention relates to an exposure apparatus used in a photolithography step for producing semiconductor devices and so on. In particular, the present invention relates to an exposure apparatus having a function capable of cleaning a substrate holding member which is used for holding a photosensitive substrate on a photosensitive substrate stage.

DESCRIPTION OF THE RELATED ART

Production of semiconductor devices, liquid crystal display devices and so on through a photolithography step is performed by using an exposure apparatus for exposing a substrate, for example, a wafer having its surface on which a photosensitive material such as a photo resist is applied. The substrate is exposed with a pattern image formed on a mask or a reticle. Such a conventional exposure apparatus includes a wafer holder (substrate holder) attached on a wafer stage for attracting and holding the wafer in order to immobilize and hold the wafer in a flat state.

However, if the wafer is attracted in the presence of contaminants such as dust or grime between the wafer and the wafer holder for holding the wafer, the contaminants deteriorate the flatness of an exposure surface on the wafer. The deterioration of the flatness of the exposure surface principally causes a positional discrepancy error or the like of each shot area on the wafer, which has been a significant factor in relation to deterioration of the yield upon production of LSI and so on. For this reason, the exposure operation has been hitherto interrupted at a certain interval so that the wafer holder is moved to a position within reach of an operator. After that, the operator manually wipes either a contact surface of the wafer holder to contact with the wafer (hereinafter referred to as "upper surface", if necessary) or the entire wafer holder with a whetstone or a dust-free cloth.

However, when an operator cleans the wafer holder manually (with hands) as performed in the conventional art, a period of time, for example, about 30 minutes to 1 hour is required to wipe the entire surface of the wafer holder. Accordingly, an inconvenience arises in that the time usable for practical exposure is shortened, resulting in decrease in throughput. If the frequency of cleaning for the wafer holder is about once per day in order to lengthen the time useable for exposure, it becomes highly probable that the wafer is exposed while contaminants remain adhering onto the wafer holder, with a fear that the yield of semiconductor devices may be deteriorated. Since an operator cleans the wafer holder manually, an inconvenience also arises in that the finish of cleaning is different because of the difference in degree of skill of operators, with a result that only a specified operator could perform the operation.

Recently, semiconductor-manufacturing factories are required to fulfill a degree of cleanness of class 10 to 100 or less for accuracy. In addition, automation to avoid manual operation is advanced. Such a situation results from the following reasons. Firstly, more accurate alignment and auto focus techniques are required in semiconductor production steps for achieving more precise and finer manipulation. Secondly, the wafer itself deforms due to contaminants existing on the back surface of the wafer, resulting in inconveniences that an alignment result suffers an error, exposure undergoes a trouble, and so on. Finally, the presence of contaminants such as grimes greatly affects the yield of products. Those resulting from operator occupy a large proportion of all causes of occurrence of contaminants. For example, secondary dust release, in which newly released dust from an operator adheres to a wafer holder, has also raised a problem.

In such a situation, the conventional apparatus uses the operation in which an operator removes contaminants on the wafer holder does not follow the requirement for cleanness. In addition, there is a fear that such an operation rather deteriorates the degree of cleanness as well.

In order to improve such drawbacks, various automatic cleaning mechanisms for wafer holders have been recently proposed. For example, Japanese Patent Laid-open No. 5-82411 discloses a semiconductor exposure apparatus comprising a cleaning system for cleaning a wafer-carrying surface of a wafer chuck (holder).

Some contaminants between a back surface of a wafer and a holder are easily eliminated, however, other contaminants tightly adhere to the wafer holder, and they are scarcely separated from the wafer holder. Accordingly, the conventional automatic cleaning mechanism not necessarily succeeded in sufficient removal of contaminants. On the other hand, Japanese Patent Laid-open No. 7-66114 discloses a cleaning apparatus for exposure apparatuses. This cleaning apparatus determines an area within a wafer holder surface for which cleaning is necessary, and it cleans only the determined area. As disclosed in this document, it is also possible to use a whetstone or the like as a cleaning member. However, the use of a whetstone in the mentioned apparatus has inconveniences that the cleaning effect decreases when the whetstone is worn, and the apparatus necessarily has to be stopped for exchange of the whetstone.

There is also a fear that contaminants removed from the contact surface of the wafer holder to contact with the wafer may fall into grooves formed on the surface of the wafer holder. The contaminants may float in the air due to turbulence of air upon wafer exchange or other situations, and they may adhere to the contact surface of the wafer holder again. If such contaminants are interposed between the wafer holder and the wafer, the contaminants cause lateral discrepancy of the wafer. In the semiconductor production steps for achieving finer manipulation as described above, a serious problem has arisen resulting from the lateral discrepancy of the wafer, that is deterioration of overlay accuracy (alignment accuracy) for overlay exposure.

SUMMARY OF THE INVENTION

An object of the present invention is to dissolve the inconveniences associated with the conventional art, and provide an exposure apparatus which can improve the throughput without deterioration of the yield of semiconductor devices and so on which would be caused by contaminants existing on a substrate holder.

Another object of the present invention is to dissolve the inconveniences associated with the conventional art, and provide an exposure apparatus including a cleaning mechanism which can clean a,substrate holding member reliably over a long period of time without deterioration of the throughput of the exposure apparatus.

Still another object of the present invention is to dissolve the inconveniences associated with the conventional art, and provide an exposure apparatus including a cleaning mechanism which can clean a substrate holding member reliably, and prevent the substrate holding member from re-adhesion of removed contaminants.

According to a first aspect of the present invention, there is provided an exposure apparatus for transferring a pattern formed on a mask onto a photosensitive substrate, comprising:

a substrate holding member for holding the photosensitive substrate;

a stage for detachably supporting the substrate holding member;

an attaching/detaching mechanism for attaching and detaching the substrate holding member to and from the stage;

a storing unit for storing the substrate holding member; and a substrate holding member transport system for receiving and transmitting the substrate holding member from and to each of the attaching/detaching mechanism and the storing unit, and transporting the substrate holding member between the attaching/detaching mechanism and the storing unit.

According to the present invention, the substrate holding member transport system, for example, a transport system for a substrate holder receives and transmits the substrate holder from and to each of the attaching/detaching mechanism and the storing unit, and it also transports the substrate holder between the attaching/detaching mechanism and the storing unit. Therefore, for example, a clean substrate holder may be previously stored in the storing unit. Accordingly, the transport system transports the clean substrate holder stored in the storing unit to a place of the attaching/detaching mechanism. The transport system receives a dirty substrate holder on the stage, and it transmits the clean holder to the attaching/detaching mechanism. The attaching/detaching mechanism receives the clean holder to install it to the stage. Accordingly, the dirty substrate holder on the stage is exchanged for the clean substrate holder during stoppage of the apparatus in a short period of time. Thus the holder can be always maintained in a clean state without stopping the apparatus for a long period of time.

According to a second aspect of the present invention, there is provided an exposure apparatus for transferring a pattern formed on a mask onto a photosensitive substrate, comprising:

a substrate holding member for holding the photosensitive substrate;

a stage for detachably supporting the substrate holding member;

an attaching/detaching mechanism for attaching and detaching the substrate holding member to and from the stage;

a washing unit for washing the substrate holding member; and a substrate holding member transport system for receiving and transmitting the substrate holding member from and to each of the attaching/detaching mechanism and the washing unit, and transporting the substrate holding member between the attaching/detaching mechanism and the washing unit.

According to the exposure apparatus as specified in the second aspect of the present invention, the substrate holding member transport system, for example, a transport system for a substrate holder receives and transmits the substrate holder from and to each of the attaching/detaching mechanism and the washing unit, and it also transports the substrate holder between the attaching/detaching mechanism and the washing unit. Therefore, the transport system receives a dirty substrate holder on the stage, and it transports the dirty substrate holder to a place of the washing unit to transmit it to the washing unit. The washing unit receives the dirty substrate holder, and it transmits the substrate holder to the transport system after washing. The transport system transports the substrate holder after washing to a place of the attaching/detaching mechanism to transmit it to the attaching/detaching mechanism. The attaching/detaching mechanism receives the substrate holder after washing to install it to the stage. Accordingly, when the substrate holder on the stage becomes dirty, the dirty substrate holder is washed by the washing unit, and then it is installed again onto the stage. Thus the substrate holder can be always maintained in a clean state without stopping the apparatus for a period of time not less than a period of time required for washing.

According to a third aspect of the present invention, there is provided an exposure apparatus for transferring a pattern formed on a mask onto a photosensitive substrate, comprising:

a substrate holding member for holding the photosensitive substrate;

a stage for detachably supporting the substrate holding member;

an attaching/detaching mechanism for attaching and detaching the substrate holding member to and from the stage;

a storing unit for storing the substrate holding member;

a washing unit for washing the substrate holding member; and a substrate holding member transport system for receiving and transmitting the substrate holding member from and to each of the attaching/detaching mechanism, the storing unit, and the washing unit, and transporting the substrate holding member among the attaching/detaching mechanism, the storing unit, and the washing unit.

According to the exposure apparatus as specified in the third aspect of the present invention, the substrate holding member transport system, for example, a transport system for a substrate holder receives and transmits the substrate holder from and to each of the attaching/detaching mechanism, the storing unit, and the washing unit, and it also transports the substrate holder among the attaching/detaching mechanism, the storing unit, and the washing unit for the substrate holder. In this aspect, the transport system receives a dirty substrate holder from the attaching/detaching mechanism, and it transports the dirty substrate holder to a place of the washing unit to transmit it to the washing unit. The washing unit receives the dirty substrate holder, and transmits it to the transport system after washing. The transport system transports the substrate holder after washing to a place of the storing unit to transmit it to the storing unit. The substrate holder after washing transmitted to the storing unit is stored in the storing unit. During washing, the transport system transports a clean substrate holder previously stored in the storing unit to a place of the attaching/detaching mechanism to transmit the clean substrate holder to the attaching/detaching mechanism. The attaching/detaching mechanism receives the clean substrate holder to install it to the stage. Accordingly, the dirty substrate holder on the stage is exchanged for the clean substrate holder during stoppage of the apparatus in a short period of time. Moreover, the substrate holder with adhering contaminants after the exchange is washed and stored again in the storing unit. Thus the substrate holder can be always maintained in a clean state without stopping the apparatus for a long period of time only by preparing at least two substrate holders.

In the exposure apparatus according to the first to third aspects of the present invention, the substrate holding member transport system may comprise a guide provided between or among the attaching/detaching mechanism and/ or the storing unit and/or the washing unit, a mechanism for vertically moving and rotating the substrate holding member, and a mechanism for receiving and transmitting the substrate holding member from and to the attaching/ detaching mechanism and/or the storing unit and/or the washing unit. The mechanism for receiving and transmitting the substrate holding member may adopt a transport arm or a robot hand provided with a substrate holding member grasping section which is movable along the guide and rotatable while grasping the substrate holding member.

According to a fourth aspect of the present invention, there is provided an exposure apparatus for transferring a pattern formed on a mask onto a photosensitive substrate, comprising:

a substrate stage for moving the photosensitive substrate two-dimensionally in a reference plane;

a substrate holding member for being placed on the substrate stage and attracting and holding the photosensitive substrate; and a cleaning unit for cleaning the substrate holding member; the cleaning unit comprising:

a transport system for transporting a cleaning member and receiving and transmitting the cleaning member from and to the substrate holding member;

an engaging member for detachably engaging with the cleaning member on the substrate holding member;

a rotary driving means for driving and rotating the cleaning member on the substrate holding member integrally with the engaging member in a state of engagement of the engaging member with the cleaning member; and a vertical movement means for moving the engaging member and the rotary driving means along a first direction perpendicular to a movement plane of the substrate stage.

According to the exposure apparatus as specified in the fourth aspect of the present invention, when the substrate stage is moved to a predetermined position, and the cleaning member, for example, a whetstone is transported and transmitted onto the substrate holding member by the transport system, then the vertical movement means drives the engaging member and the rotary driving means toward the whetstone along the first direction perpendicular to the movement plane of the substrate stage. When the engaging member engages with the whetstone on the substrate holding member, the rotary driving means rotates the engaging member on the substrate holding member integrally with the whetstone. Accordingly, the substrate holding member is powerfully cleaned by the cleaning member such as the whetstone. In this aspect, the whetstone may be rotated on the substrate holding member while two-dimensionally moving the substrate stage within a predetermined range. In such an embodiment, the entire surface of the substrate holding member is more powerfully cleaned at once. When the engaging member is disengaged from the whetstone after completion of the cleaning, the vertical movement means moves the engaging member and the rotary driving means in a direction opposite to the previous direction along the first direction, and the whetstone on the substrate holding member is transported by the transport system to the outside of the substrate holding member.

According to a fifth aspect of the present invention, there is provided an exposure apparatus for transferring a pattern formed on a mask onto a photosensitive substrate, comprising:

a substrate stage for moving the photosensitive substrate two-dimensionally in a reference plane;

a substrate holding member, placed on the substrate stage, for attracting and holding the photosensitive substrate;

a movement means for placing a cleaning member on the substrate holding member and retracting the cleaning member from the substrate holding member;

a cleaning means for cleaning the substrate holding member by rotating the cleaning member on the substrate holding member; and a gas drawing means for drawing gas existing in the vicinity of a surface of the substrate holding member. In this exposure apparatus, the drawing means may comprise a drawing port, and the drawing port may be capable of approaching and leaving the substrate holding member on the substrate stage. The exposure apparatus may further comprise a gas blowing means for blowing gas on the surface of the substrate holding member. Accordingly, when the blowing means blows gas such as air onto the surface of the substrate holding member, even if the surface of the substrate holding member has irregularities, contaminants having adhered to their vicinity are raised and floated in the air. The contaminants are drawn and removed by the gas drawing means through the drawing port arranged to oppose to the blowing port.

In the exposure apparatus according to the present invention, the cleaning member may have its contact surface formed of a porous material for contacting with the substrate holding member. For example, the contact surface may be formed of a whetstone or a cloth. Accordingly, contaminants such as dust removed by rotation of the whetstone from the surface of the substrate holding member are incorporated into a large number of pores of the whetstone. The exposure apparatus preferably further comprises a surface state measuring means for measuring a state of irregularity or inclination of the surface of the substrate attracted and held on the substrate holding member. Accordingly, the cleaning situation (situation of contaminant removal) on the surface of the substrate holding member can be confirmed by measuring the state of irregularity or inclination of the surface of the substrate attracted and held on the substrate holding member by using the surface state measuring means after the whetstone on the substrate holding member is transported by the transport system to the outside of the substrate holding member after the cleaning for the substrate holding member. Thus the cleaning can be repeatedly performed automatically in accordance with a result of the confirmation.

BRIEF DESCRIPTION OF THE DRAWINGS

FIG. 8 shows a block diagram illustrating a schematic arrangement of a control system of the apparatus shown in FIG. 1.

DETAILED DESCRIPTION OF THE PREFERRED EMBODIMENT

First Embodiment

Figure 1:
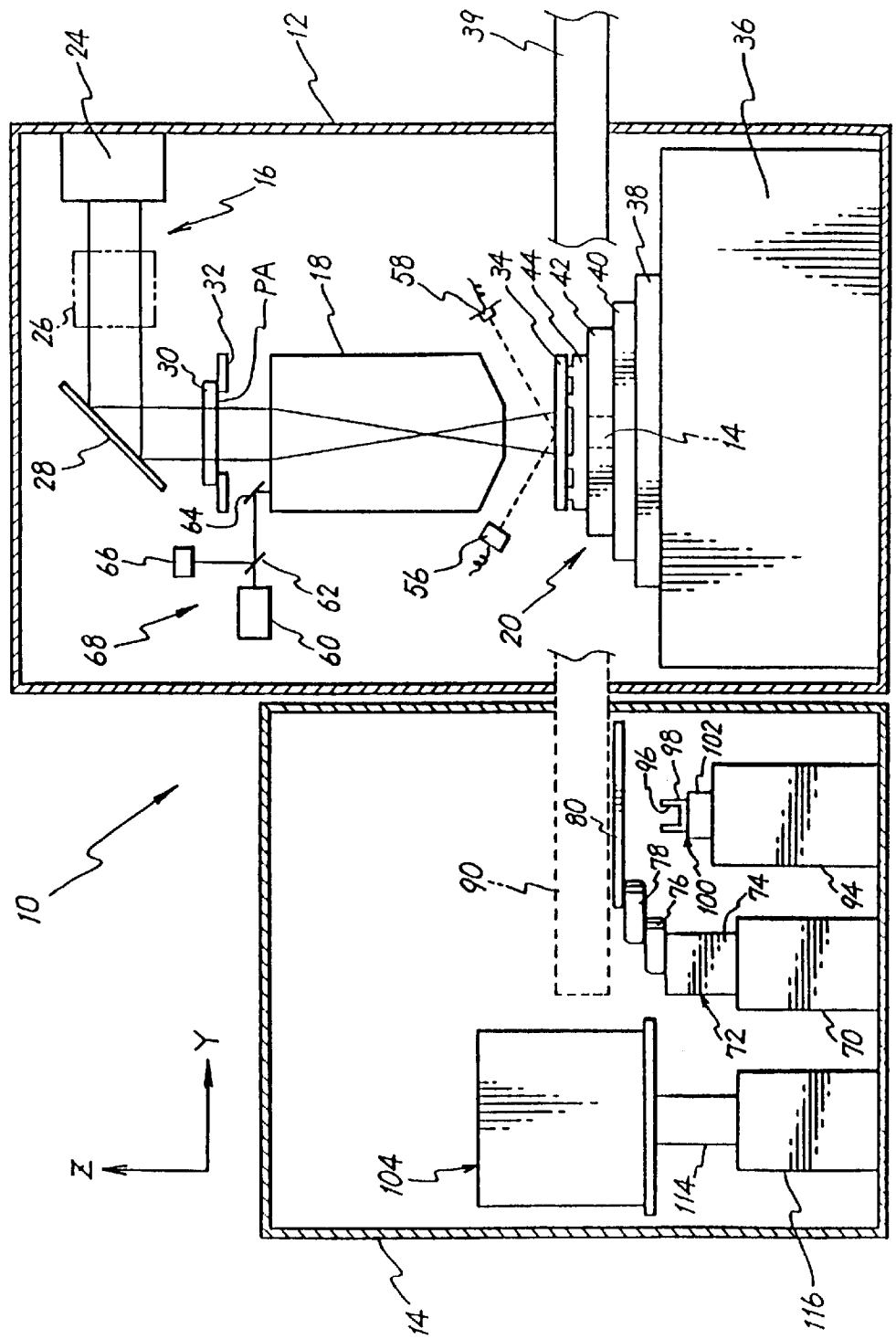
FIG. 1 shows a schematic vertical cross-sectional view illustrating an entire arrangement of an exposure apparatus according to one embodiment of the present invention.
Figure 2:
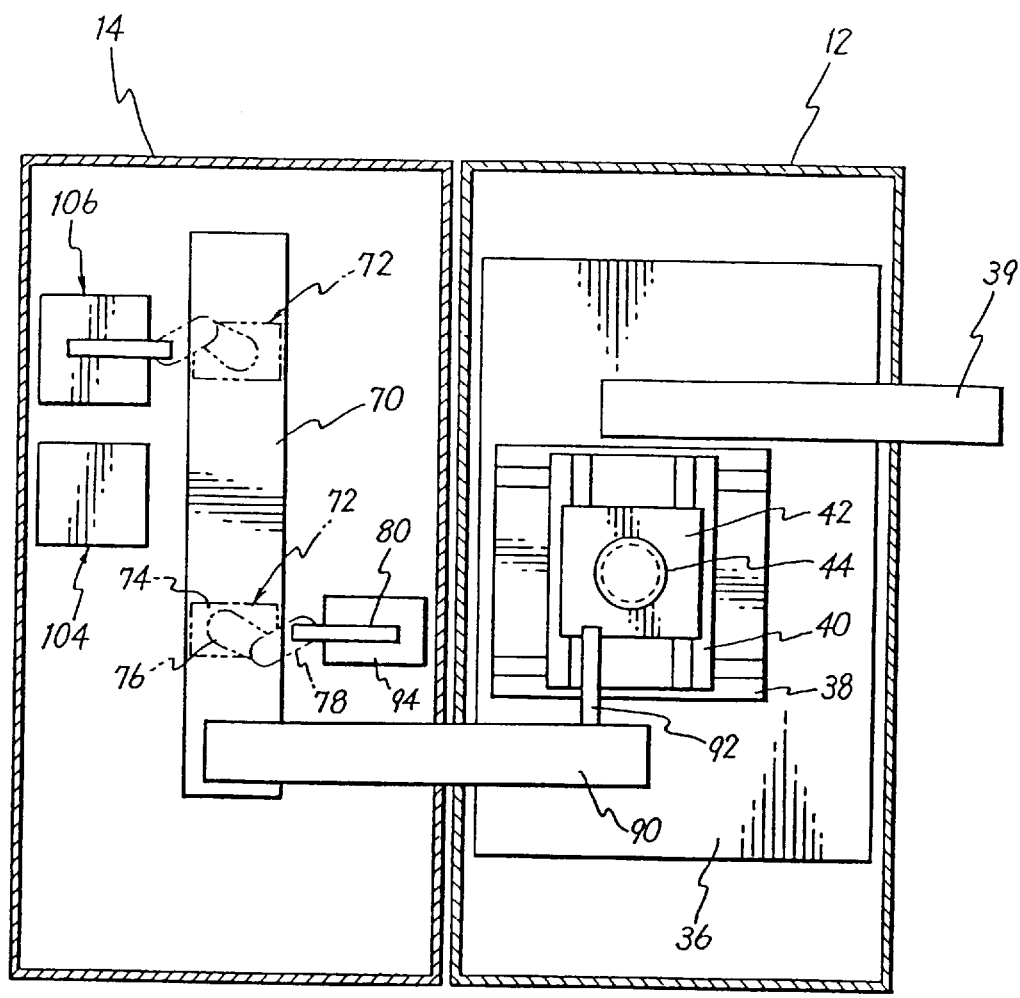
FIG. 2 shows a schematic lateral cross-sectional view illustrating the entire arrangement of the exposure apparatus shown in FIG. 1.

A first embodiment of the present invention will be explained below with reference to FIG. 1 to FIG. 13. FIGS. 1 and 2 schematically show an entire arrangement of an exposure apparatus 10 in accordance with the first to third aspects of the present invention. FIG. 1 shows a schematic vertical cross-sectional view of the exposure apparatus 10.

FIG. 2 shows a schematic lateral cross-sectional view of the exposure apparatus 10. The exposure apparatus 10 comprises a chamber 12 and a chamber 14 which are independent to one another. The two chambers 12, 14 are independently provided because of the following reasons. Namely, the interior of each of the chambers 12, 14 should be prevented from dust. Especially, the temperature and the humidity should be kept constant in the first chamber 12. The chamber 12 is controlled so that its interior always has a set temperature, for example, 20° C. with fluctuation of ±0.1° C. These chambers 12, 14 are only provided with doors which are necessary and minimum for IC production operations and maintenance for the apparatus.

The first chamber 12 accommodates the essential part of this apparatus comprising constitutive components including, for example, an irradiation optical system 16 for providing an exposure light beam, a projection optical system 18, and an XY stage unit 20.

The irradiation optical system 16 comprises a light source 24 composed of a ultra-high voltage mercury lamp, an excimer laser (KrF, ArF), a YAG laser, a YAG high harmonic (200 nm or less) laser or the like; an illumination optical system 26 composed of a filter (not shown) for transmitting only the exposure light beam radiated from the light source 24 (for example, g-ray, i-ray, excimer light beam ($\lambda$=248 nm (KrF) or 193 nm (ArF)), or YAG high harmonic laser beam (200 nm or less)), a fly's eye lens (not shown) as an optical integrator, and a diaphragm (not shown) for setting an irradiation area for the exposure light beam; and a bending mirror 28.

The bending mirror 28 is provided obliquely at an angle of about 45 degrees at a vertically upward position over the projection optical system 18 (upward position in the direction of the optical axis) at a height approximately the same as that of the light source 24. A reticle 30 as a mask is arranged horizontally (in the direction perpendicular to the optical axis) between the bending mirror 28 and the projection optical system 18. The reticle 30 is held on a reticle stage 32 which is movable two-dimensionally in a horizontal plane (XY plane) and rotatable about the vertical axis (Z axis) within a minute angle range. A predetermined pattern area PA is provided on a lower surface of the reticle 30. A circuit pattern for exposure is formed in the pattern area PA.

On the other hand, a wafer 34 as a photosensitive substrate, having its surface to which a photo resist is applied, is held on an XY stage unit 20 under the projection optical system 18 so that the surface of the wafer 34 is conjugate with the surface of the reticle 30 including the pattern area PA as described above in relation to the projection optical system 18.

Accordingly, when the reticle 30 is irradiated with the exposure light beam radiated from the light source 24 through the illumination optical system 26, the exposure light beam is transmitted through the pattern area PA on the reticle 30, and it comes into the projection optical system 18. Thus an image of the pattern, which is reduced by a factor of magnification of the projection optical system 18, is formed on the wafer 34.

Next, the XY stage unit 20 will be explained. The XY stage unit 20 comprises a base 38 fixed on a pedestal 36, a Y stage 40 which is movable on the base 38 in right and left directions (direction of the Y axis) in FIG. 1, and an X stage 42 which is movable in directions perpendicular to the plane of paper (direction of the X axis) in FIG. 1. A stepped disk-shaped wafer holder 44 (hereinafter referred to as "holder") as a substrate holder is attracted on the X stage 42 actually through a vacuum-attracting device (not shown in FIG. 1) such as a vacuum chuck 140 (see FIG. 8). The wafer 34 is attracted on the holder 44 in the same manner as the holder 44.

Figure 3:
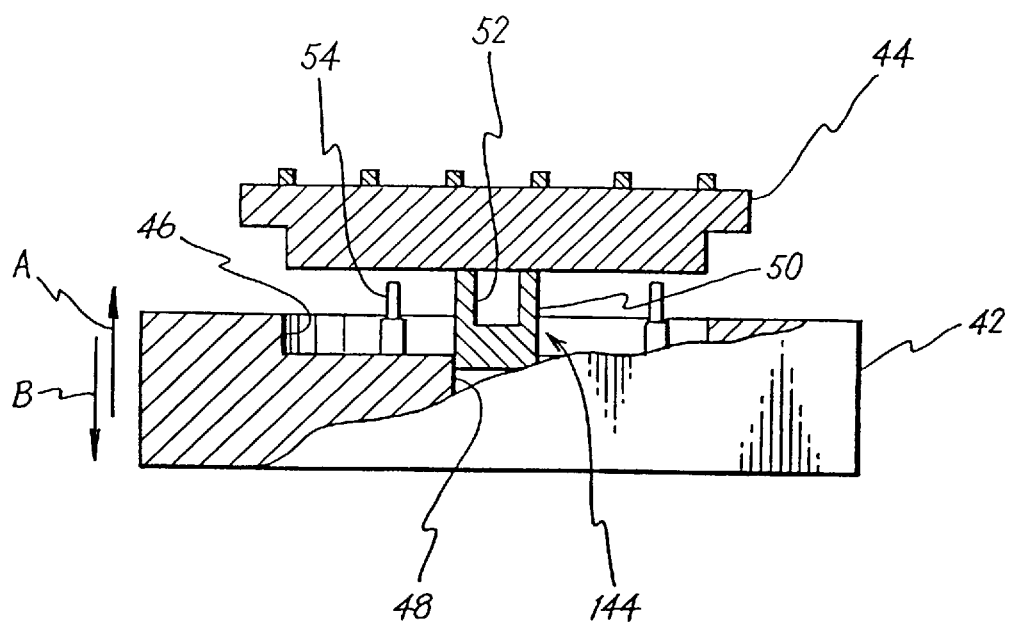
FIG. 3 shows an X stage together with a holder with partial cross section.

FIG. 3 shows the X stage 42 together with the holder 44 with partial cross section. As shown in FIG. 3, the X stage 42 is formed with a round hole 46 to which a small diameter section at the bottom of the holder 44 can be fitted. A circular guide hole 48 is bored vertically at a central portion of an inner bottom surface of the round hole 46. A holder support member 50, which is movable vertically along the guide hole 48 as illustrate by arrows A and B, is inserted into the guide hole 48. The holder. support member 50 is moved vertically by an unillustrated driving mechanism such as a piston rod which is connected to the holder support member 50 and slidable in the guide hole 48. Namely, in this embodiment, a mechanism for vertically moving the holder 144 (see FIG. 8) as an attaching/detaching mechanism is constituted by the guide hole 48, the holder support member 50, and the unillustrated driving mechanism.

A cutout 52 having an approximately U-shaped cross section is formed through an upper end of the holder support member 50. Accordingly, a forward end of a holder transport arm described below can be inserted through the cutout 52 from one position to the other position in the X axis direction in FIG. 1 (from the front side to the back side in the direction perpendicular to the plane of paper in FIG. 3) upon exchange of the holder 44.

Three vertically movable pins 54 are provided vertically on the inner bottom surface of the round hole 46, the vertically movable pins 54 constituting a mechanism for vertically moving the wafer 146 (see FIG. 8) for vertically moving and supporting the wafer 34 on three points upon exchange of the wafer. The vertically movable pins 54 have their respective forward ends capable of penetrating through the holder 44 through unillustrated round holes provided to correspond to the vertically movable pins 54.

With reference to FIG. 1 again, an irradiation optical system 56 and a light-collecting optical system 58 are arranged on both sides of the projection optical system 18 so that they are symmetrical with respect to the optical axis of the projection optical system 18. The irradiation optical system 56 and the light-collecting optical system 58 constitute a focal position adjusting mechanism (AF system) 134 of the oblique incidence system (see FIG. 8) for detecting positions in the Z direction on the surface of the wafer 34 when the wafer 34 is located within an exposure field of the projection optical system 18. When the irradiation optical system 56 radiates a light beam for image formation onto the surface of the wafer 34 obliquely, the light-collecting optical system 58 receives and photoelectrically detects a reflected light beam of the radiated light beam so that it outputs a focal signal corresponding to an amount of discrepancy of the surface of the wafer 34 from a height position (focus position) or an image formation plane of the projection optical system 18. The AF system 134 is equivalent to those disclosed in, for example, Japanese Patent Laid-open Nos. 56-42205 and 60-168112. These documents are incorporated herein by reference. In this embodiment, the AF system 134 constitutes a surface state measuring means.

In addition to the components described above, the first chamber 12 includes, for example, an alignment sensor 68 of the TTL (through the lens) system for overlay exposure of the wafer 34 comprising an alignment light source 60, a half mirror 62, a mirror 64, an alignment microscope 66, and so on; and an interferometer system 136 (see FIG. 8) for measuring the position of the X stage 42 (not shown in FIG. 1).

As shown in FIGS. 1 and 2, the second chamber 14 includes an X guide 70 provided at a central portion and extending in the X axis direction. A robot hand 72, which is movable reciprocatively in the X direction, is provided on the X guide 70. The robot hand 72 comprises a movable section 74 which is movable in the X direction along the X guide 70, a first rotatable arm 76 which is attached on the movable section 74 rotatably about a center of a rotation shaft (not shown) disposed at its proximal end, a second rotatable arm 78 with its proximal end which is attached rotatably to a forward end (rotational end) of the first rotatable arm 76, and a hand section 80 which is attached to a forward end (rotational end) of the second rotatable arm 78. Namely, the first and second rotatable arms 76, 78 of the robot hand 72 are constructed so that they are expandable or contractible and rotatable integrally about the center of the rotational shaft of the first rotatable arm 76. Therefore, the hand section 80 attached to the forward end of the second rotatable arm 78 is freely movable horizontally within an area of a circle having a predetermined radius about the center of the rotation shaft of the first rotatable arm 76.

Figure 4:
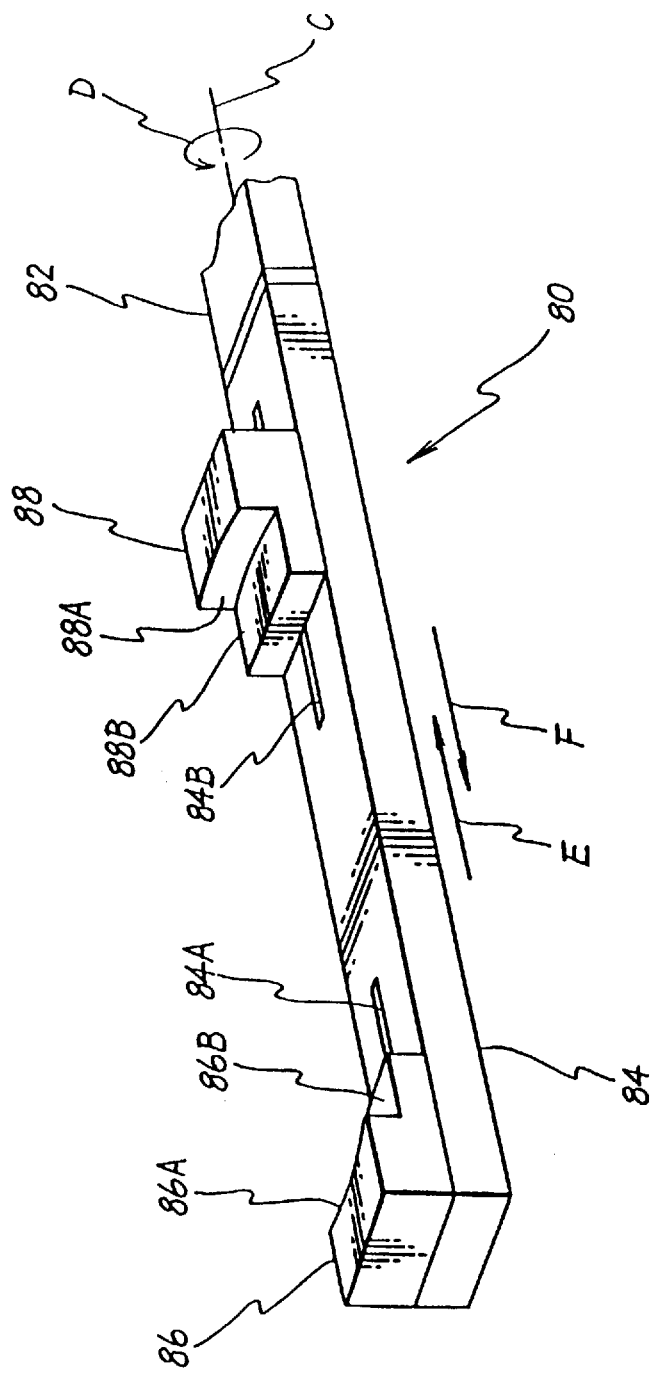
FIG. 4 shows a schematic perspective view illustrating an enlarged hand section which constitutes a robot hand.

FIG. 4 shows an enlarged forward end and its vicinity of the hand section 80. As shown in FIG. 4, the hand section 80 comprises an attachment section 82 and a forward end section 84. The forward end section 84 is constructed so that it is rotatable by 180 degrees with respect to the attachment section 82 in a direction of an arrow D and a direction opposite thereto about a center of an axis C extending in a longitudinal direction of the hand section 80. Accordingly, when the holder 44 is grasped by a pair of holder grasping sections 86, 88 as described below, the direction of the holder 44 can be inverted upside down while grasping the holder 44. The forward end section 84 includes the pair of holder grasping sections 86, 88 which are mutually opposing and composed of members having an L-shaped cross section for interposing side surfaces of the holder 44. Grasping surfaces 86A, 88A of the holder grasping sections 86, 88, which are composed of upper opposing surfaces in FIG. 4, are formed as circular arc-shaped curved surfaces. Vacuum holes (not shown) are formed on contact surfaces 86B, 88B of the holder grasping sections 86, 88 to contact with the back surface of the holder 44. The holder 44 is attracted and fixed through the vacuum holes by means of a vacuum-attracting mechanism (not shown). The holder grasping sections 86, 88 are constructed so that they are movable in directions to approach and leave with each other along guide grooves 84A, 84B as illustrated by arrows E and F. This construction is provided to make it possible to interpose a plurality types of holders 44. When only a single type of a holder 44 is used, the holder grasping sections 86, 88 may be fixedly provided at positions so that the both are separated by a distance between the grasping surfaces 86A, 88A which is approximately the same dimension as that of an outer diameter of a large diameter section of the holder 44.

With reference to FIG. 2 again, a Y guide 90 is provided between the chambers 12 and 14. The Y guide 90 extends in the Y direction in a state of penetration through the both chambers. A holder transport arm 92 (hereinafter referred to as "transport arm", if necessary) is attached to the Y guide. The holder transport arm 92 is constructed so that it is movable between the chambers 12 and 14 along the Y guide 90 and movable in the X direction within a predetermined distance range. The holder transport arm 92 has its forward end which has a structure similar to that of the hand section 80 of the robot hand 72 shown in FIG. 4. It is noted that only openings having a size corresponding to the Y guide 90 and the holder transport arm 92 are formed through side walls of the both chambers 12, 14 on the sides on which the chamber 12 contacts with the chamber 14.

As shown in FIG. 2, a receiving and transmitting stand 94 for receiving and transmitting the holder 44 between the holder transport arm 92 and the robot hand 72 is installed in the vicinity of a position at which the X guide 70 and the Y guide 90 cross in the chamber 14. The receiving and transmitting stand 94 is provided with a mechanism for vertically moving and rotating the holder 100 including a holder holding member 98 with a cutout 96 having a U-shaped cross section formed at its upper end as shown in FIG. 1, in the same manner as the mechanism for vertically moving the holder 144 on the X stage 42 described above. The mechanism for vertically moving and rotating the holder 100 comprises a cylindrical guide 102 with a part of its upper end exposed over the receiving and transmitting stand 94, and the holder holding member 98 described above which slides vertically through the interior of the cylindrical guide 102. The holder holding member 98 is rotatable within a range of 90 degrees about its rotational axis in the Z direction starting from a position shown in FIG. 1. The holder holding member 98 can hold the holder 44 such that the holder transport arm 92 is inserted into the cutout 96. Accordingly, for example, the holder 44 can be received from the holder transport arm 92 and transmitted to the robot hand 72 as described in detail below.

In this embodiment, as shown in FIG. 2, a holder storing unit 104 (hereinafter referred to as "storing unit", if necessary) as a storing unit and a holder washing unit 106 are installed on a side in the chamber 14 opposite to a side of the chamber 12 with the X guide 70 intervening therebetween. The holder 44 can be received and transmitted by moving the robot hand 72 to a position in front of the holder storing unit 104 or a position in front of the holder washing unit 106 as described below.

Figure 5:
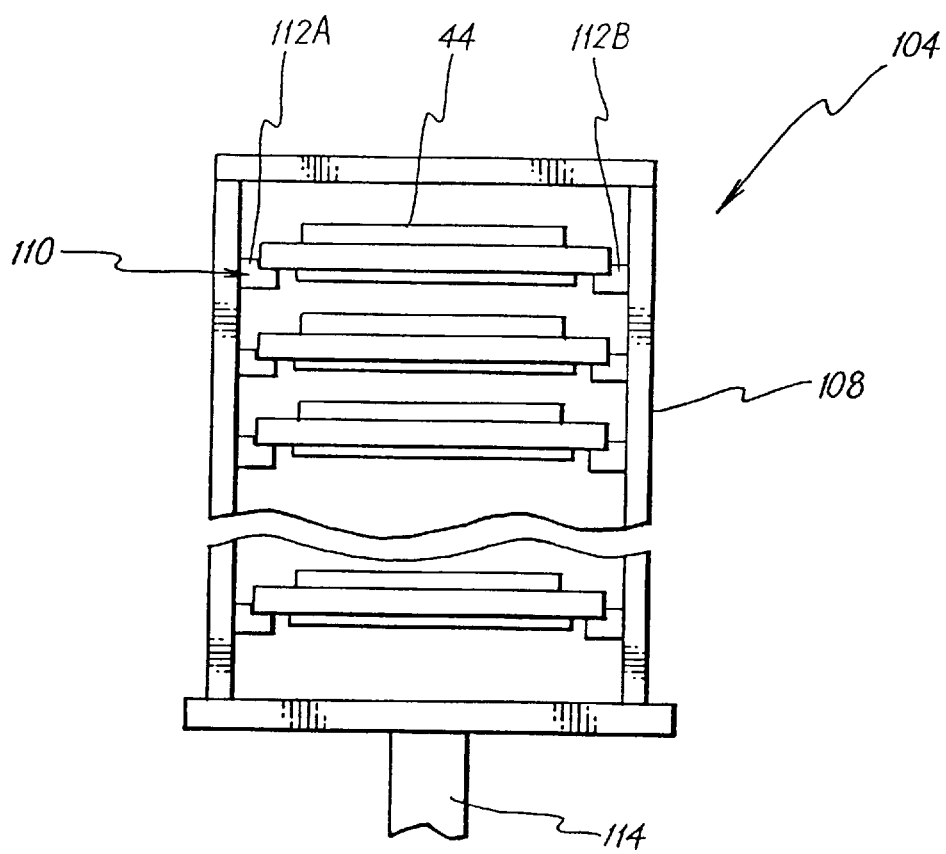
FIG. 5 shows a right side view as viewed in FIG. 1 for illustrating a holder storing unit with partial omission.

FIG. 5 shows a right side view of the holder storing unit 104 as viewed in FIG. 1 with partial omission. The storing unit 104 is provided for storing clean holders 44. The storing unit 104 comprises a box-shaped outer case 108, and a plurality steps of holder support shelves 110 which are arranged vertically at a predetermined spacing distance on inner sides of both walls of the outer case 108. Each of the holder support shelves 110 is constituted by a pair of right and left shelf members 112A, 112B having an L-shaped cross section provided to extend in a direction (Y direction) perpendicular to the plane of paper in FIG. 5. The holder storing unit 104 is supported by a support section 114. The support section 114 is vertically movable through a vertical sliding guide (not shown) provided in a base stand 116 shown in FIG. 1. The support section 114 is moved vertically by a driving mechanism 154 (see FIG. 8) contained in the base stand 116. Accordingly, it is possible to adjust the positional relation in the direction of height between the holder support shelf 110 at a desired step in the holder storing unit 104 and the hand section 80 of the robot hand 72.

In this embodiment, the following procedure may be adopted. Firstly, all steps of the holder support shelves 110 in the holder holding unit 104 are allowed to support holders 44 previously. Secondly, a holder 44 after washing is imported into a holder support shelf 110 of the same step as a step from which a holder 44 has been exported. Finally, an order to export and import holders 44 is previously set, for example, from the upper to the lower, or from the lower to the upper, so that the holder storing unit 104 is successively raised or lowered in accordance with the order. Thus such a procedure proceeds exactly as if holders 44 are successively fed in the storing unit 104 every time when a new holder 44 is imported, and a holder 44 imported earliest is preferentially exported. It is noted that a mechanism for realizing such successive feeding of holders 44 may be practically constituted by using a special belt conveyer.

As shown in FIG. 5, the holder 44 is desirably stored upside down so that the contact portion to contact with the wafer is directed downwardly, judging from a viewpoint that the contact portion is prevented from adhesion of contaminants due to its falling existing in an atmosphere in the chamber 14 or the holder storing unit 104. For such a storage method, the holder 44 after washing in a state shown in FIG. 6A may be inverted by inverting the forward end 84 of the hand section 72 before the holder 44 is imported into the holder storing unit 104 so that the holder 44 is imported into the storing unit 104 in a state shown in FIG. 6B.

Figure 7:
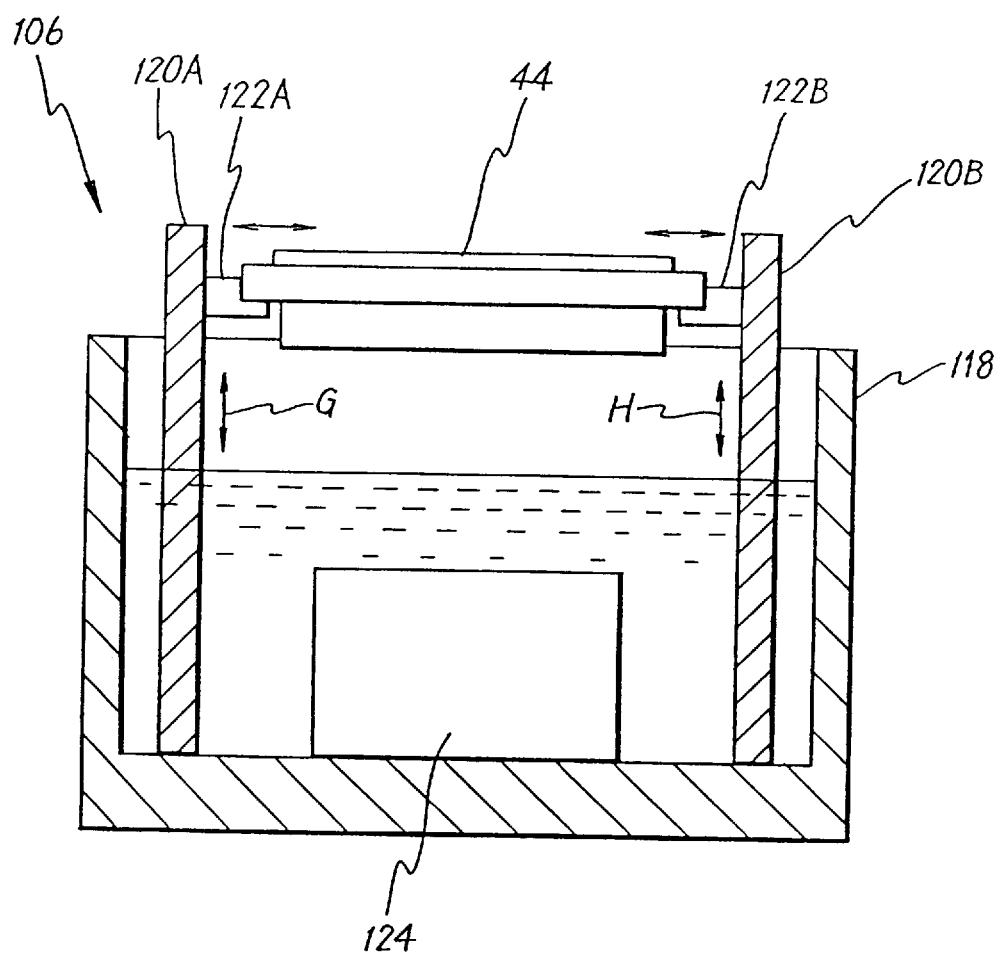
FIG. 7 shows a right side cross-sectional view as viewed in FIG. 1 for illustrating a holder washing unit.

FIG. 7.shows a schematic vertical cross-sectional view (right side cross-sectional view as viewed in FIG. 2) of the washing unit 106. As shown in FIG. 7, the washing unit 106 comprises a water tank 118 in which a predetermined amount of pure water is accommodated, a pair of side plates 120A, 120B provided to oppose to each other in the water tank 118, a pair of holder support members 122A, 122B composed of members having an L-shaped cross section which are movable vertically as indicated by arrows G and H along guide grooves (not shown) formed on the side plates 120A, 120B along a vertical direction respectively, and a ultrasonic generator 124 installed in the water tank 118.

When the holder 44 is washed in the washing unit 106, the holder 44, which is grasped at its both ends in a direction perpendicular to the plane of paper in FIG. 7 by the holder grasping sections 86, 88 of the hand section 80, is inserted in a predetermined amount from a front side toward a back side with respect to the plane of paper in FIG. 7 in a state in which the holder support members 122A, 122B are lowered a little. In this state, the holder support members 122A, 122B are raised, and then the hand section 80 is retracted. As a result, a state shown in FIG. 7 is given in which the holder 44 is supported by the underlying holder support members 122A, 122B. Next, the holder support members 122A, 122B are lowered. Thus the holder 44 is immersed in pure water in the water tank 118. When the ultrasonic generator 124 is turned on in this state, a ultrasonic wave is generated to wash the holder 44 in the same manner as washing for glasses. Instead of pure water, various solvents capable of washing out conceivable contaminants (chemical agents represented by the resist) may be prepared to successively immerse the holder 44 therein, followed by drying. The immersion and drying may be repeated. When contaminants cannot be eliminated only by immersion, the holder surface may be rubbed with a nonwoven brush made of a material such as nylon. Reference numeral 39 indicates a wafer transport system in FIGS. 1 and 2.

Next, an arrangement of a control system of the apparatus 10 of this embodiment will be explained with reference to FIG. 8. This control system is principally comprises a first control unit 130 and a second control unit 132. Each of the first and second control units 130, 132 comprises a so-called microcomputer, a minicomputer or the like including, for example, CPU, ROM, RAM, an input interface, and an output interface. The first and second control units 130, 132 are connected to one another through a system bus.

The AF system 134 and the interferometer system 136 are connected to an input side of the first control unit 130. Connected to an output side of the first control unit 130 are a stage driving system 138 for driving the X stage 42 and the Y stage 40, the vacuum chuck 140 for attracting the holder 44 onto the X stage 42, a vacuum-attracting means 142 for attracting the holder 44 onto the transport arm 92, the mechanism for vertically moving the holder 144 on the X stage 42, the mechanism for vertically moving the wafer 146 comprising the three vertically movable pins 54 and a driving unit there for, a transport arm driving system 148 for driving the transport arm 92 in the XY directions, a wafer loader driving system 150 for driving a loading arm and an unloading arm which constitute a wafer loader (not shown), and so on.

Connected to an output side of the second control unit 132 are the mechanism for vertically moving and rotating the holder 100, a robot hand control system 152 for controlling respective driving units which constitute the robot hand (including the unillustrated vacuum-attracting means communicating with the unillustrated vacuum holes of the hand section 80), the driving mechanism 154 for the holder storing unit 104, a support member driving system 156 for vertically driving the support members 122A, 122B of the washing unit 106, the ultrasonic generator 124, and so on.

Next, major operations of the apparatus of this embodiment constructed as described above will be explained, principally referring to control operations of the first and second control units 130, 132.

Figure 9A:
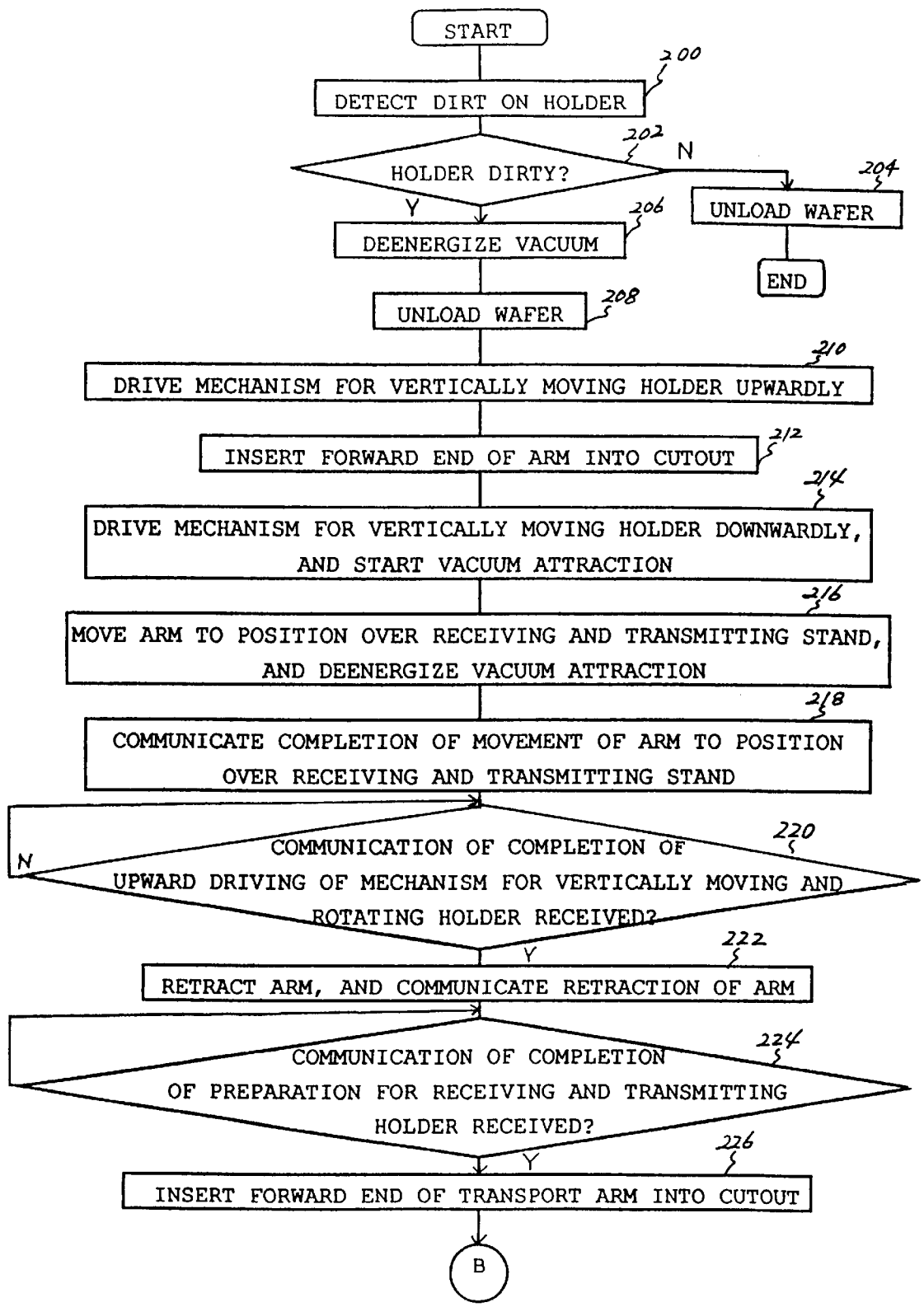
FIGS. 9A and 9B show a flow chart illustrating a principal control algorithm of a first control unit.
Figure 9B:
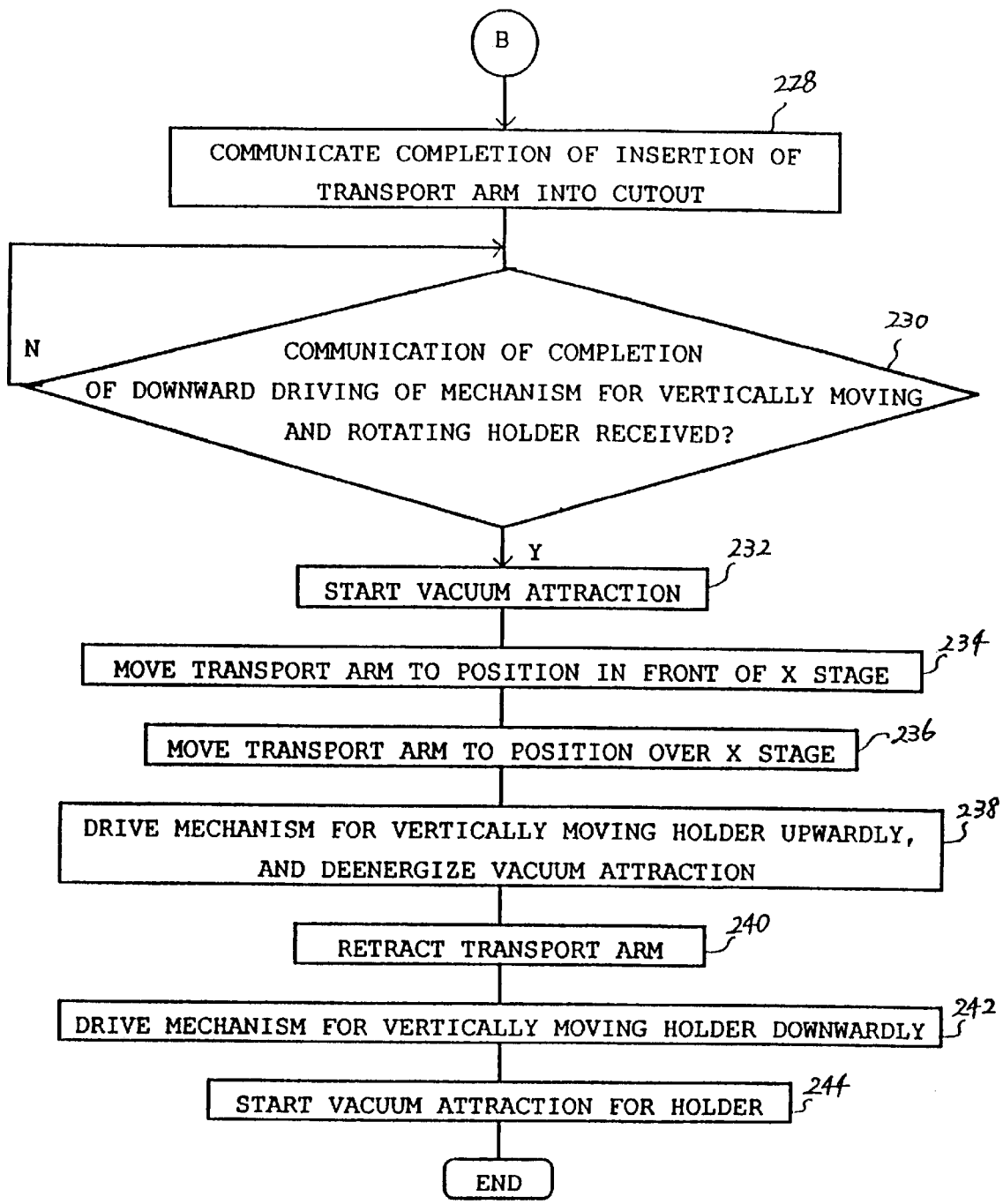
Figure 10:
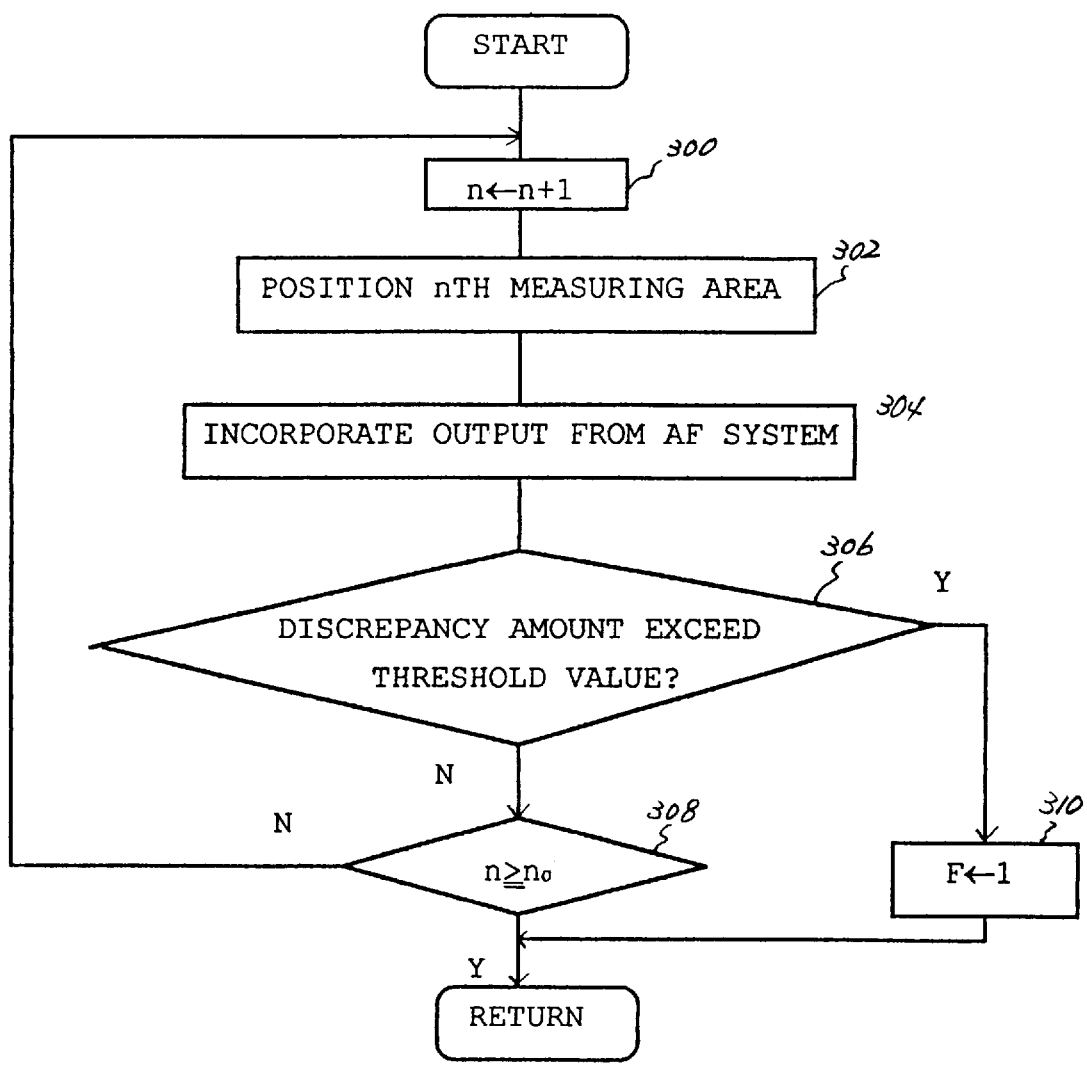
FIG. 10 shows a flow chart illustrating a subroutine of "DETECT DIRT ON HOLDER" in FIG. 9.

At first, the control operation of the first control unit 130 will be explained along with a flow chart in FIGS. 9A and 9B which illustrates a principal control algorithm. This control algorithm starts when a predetermined number of exposure cycles by the step-and-repeat system are completed, and a test wafer having an extremely high flatness is attracted onto the holder 44 on the X stage 42. The test wafer is a wafer to be used to judge whether or not the contact surface of the holder 44 to contact with the wafer is dirty. After the test wafer is attracted onto the holder 44, focal points are measured on several areas on the wafer. The dirt on the holder 44 is judged depending on whether or not measured focal discrepancy amounts exceed a predetermined value. It is premised that an unillustrated counter for indicating a number of a measuring area on the wafer (test wafer) described below is reset (count value n←0), and a flag for indicating dirt on the holder 44 described below is also reset (F←0).

At first, a process of a subroutine of "DETECT DIRT ON HOLDER" is executed in a step 200. As shown in a flow chart in FIG. 10, the subroutine makes increment for the unillustrated counter for indicating a number of a measuring area by 1 (n←n+1) in a step 300. After that, the subroutine proceeds to a step 302 to position an nth measuring area on the wafer within the image field of the projection optical system 18. The positioning is performed on the basis of coordinate position data of the measuring area previously stored in RAM and output coordinate data from the interferometer system 136.

In the next step 304, an output from the AF system is incorporated. The subroutine proceeds to a step 306 to judge whether or not the positional discrepancy amount (focal discrepancy amount) of the wafer surface in the direction of the optical axis exceeds a predetermined threshold value on the basis of the output from the AF system 134 incorporated in the step 304. If this judgment is negated, the subroutine proceeds to a step 308 to judge whether or not the counted value n is not less than a number $n_0$ of all measuring areas to be measured. Thus it is judged whether or not the measurement of focal discrepancy is completed for all measuring areas. If the judgment in the step 308 is negated, the subroutine returns to the step 300 to repeat the processing and judgment as described above. On the other hand, if the judgment in the step 306 is affirmed, the subroutine proceeds to a step 310 to set the flag described above (F←0). After that, the subroutine returns to a step 202 in the main routine in FIGS. 9A and 9B. If the measurement of focal discrepancy is completed for all measuring areas, and the judgment in the step 308 is affirmed, then the subroutine also returns to the step 202 in the main routine.

In the step 202 in the main routine, it is judged whether or not the holder 44 is dirty by judging whether or not the flag described above is "0". If the judgment in the step 202 is negated, namely if the holder 44 is not dirty, the routine proceeds to a step 204 to unload the test wafer by driving the unillustrated wafer unloading arm through the wafer loader driving system 150. After that, the series of processing of this routine ends. In this case, an ordinary exposure process is continued thereafter. When the wafer is unloaded, the attraction for the wafer is deenergized.

On the other hand, if the judgment in the step 202 is affirmed, namely if the holder 44 is dirty and contaminants adhere thereto, then the routine proceeds to a step 206 to deenergize the attraction for the holder 44 on the X stage 42 through the vacuum chuck 140. After that, the routine proceeds to a step 208 to unload the test wafer by driving the wafer unloading arm through the wafer loader driving system 150.

In the next step 210, the mechanism for vertically moving the holder 144 is driven upwardly. Accordingly, the holder support member 50 is raised to lift the holder 44 in a predetermined amount in a state in which the underlying holder support member 50 supports the holder 44. At this time, the holder support member 50 is at a position in height at which a position of the cutout 52 is approximately coincident with a position in height of the transport arm 92 waiting in front of the X stage 42.

In the next step 212, the transport arm 92 is driven through the transport arm driving system 148 to insert the forward end of the transport arm 92 into the cutout 52 of the holder support member 50 which supports the holder 44. At this time, the transport arm 92 is inserted up to a position at which the holder 44 is viewed to just interpose between the grasping members (corresponding to the holder grasping members 86, 88 in FIG. 4) as viewed in a plan view.

In the next step 214, the mechanism for vertically moving the holder 144 is driven downwardly, and attraction (vacuum attraction) for the holder 44 by the transport arm 92 is started through the vacuum-attracting means 142. Accordingly, the support member 50 is separated from the holder 44, and the holder 44 is attracted and held by the transport arm 92.

In the next step 216, the transport arm 92 which holds the holder 44 is moved to a position over the receiving and transmitting stand 94 through the transport arm driving system 148, and the attraction (vacuum attraction) for the holder 44 by the transport arm 92 is deenergized through the vacuum-attracting means 142. At this time, the transport arm 92 is disposed at a position at which it just overlaps the cutout 96 of the holder holding member 98 of the mechanism for vertically moving and rotating the holder 100. Accordingly, the transport arm is disposed at a position so that the holder 44 having been supported by the transport arm 92 is supported by the underlying holder holding member 98 when the holder holding member 98 is raised.

In the next step 218, it is communicated to the second control unit 132 that the movement of the transport arm 92 to the position over the receiving and transmitting stand 94 is completed. After that, the routine proceeds to a step 220 to wait for communication from the second control unit 132 that upward driving of the mechanism for vertically moving and rotating the holder 100 is completed.

Next, control operations of the second control unit 132 will be explained with reference to a flow chart in FIG. 11 which illustrates a principal control algorithm of the second control unit 132. This control algorithm starts when the second control unit 132 receives communication from the first control unit 130 that the movement of the transport arm 92 to the position over the receiving and transmitting stand 94 is completed.

At first, a process of a subroutine of "RECEIVE AND TRANSMIT HOLDER FROM AND TO WASHING UNIT" is executed in a step 400.

Figure 12:
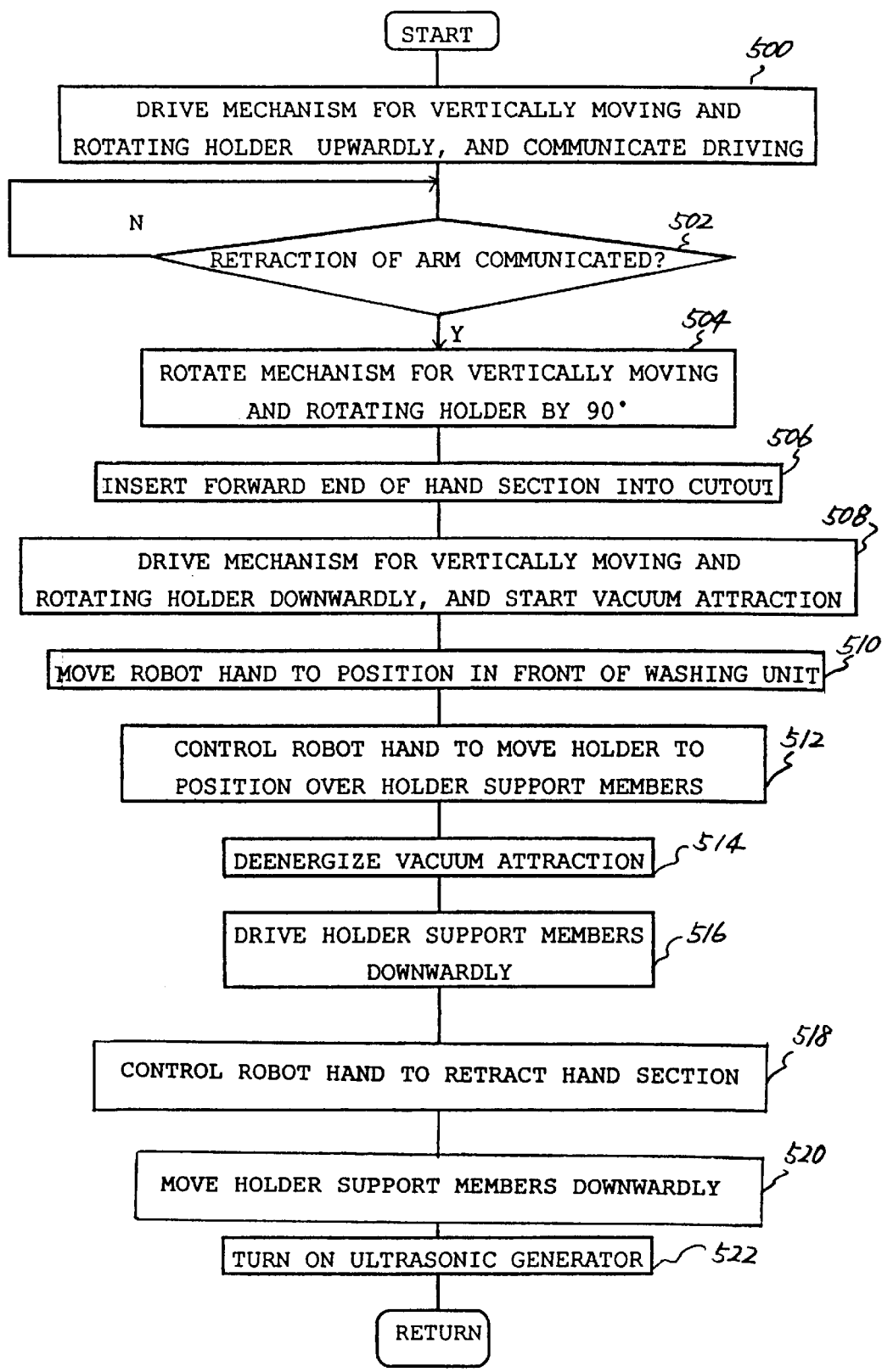
FIG. 12 shows a flow chart illustrating a subroutine of "RECEIVE AND TRANSMIT HOLDER FROM AND TO WASHING UNIT" in FIG. 11.

In this subroutine, as shown in a flow chart in FIG. 12, the mechanism for vertically moving and rotating the holder 100 is driven upwardly in a step 500, and it is communicated to the first control unit 130 that the upward driving of the mechanism for vertically moving and rotating the holder 100 is completed. After that, the subroutine proceeds to a step 502 to wait for communication from the first control unit 130 that retraction of the transport arm 92 is completed.

Now the explanation temporarily returns to the operation of the first control unit 130. As described above, the first control unit 130 is in the step 220 in which the routine waits for communication from the second control unit 132 that the upward driving of the mechanism for vertically moving and rotating the holder 100 is completed. When this communication is received, the judgment in the step 220 is affirmed. Thus the routine proceeds to a step 222 to retract the transport arm 92 frontwardly in the X axis direction through the transport arm driving system 148, and communicate to the second control unit 132 that the retraction of the arm 92 is completed. After that, the routine proceeds to a step 224 to wait for communication from the second control unit 132 that preparation for receiving and transmitting the holder 44 is completed.

Now the explanation returns to the operation of the second control unit 132 again. As described above, the second control unit 132 is in the step 502 in which the subroutine waits for communication from the first control unit 130 that the retraction of the transport arm 92 is completed. When this communication is received, the judgment in the step 502 is affirmed. Thus the subroutine proceeds to a step 504 to rotate the mechanism for vertically moving and rotating the holder 100 by 90 degrees. Accordingly, the holding member 98 is rotated by 90 degrees while holding the holder 44 to provide a state in which the cutout 96 of the holding member 98 opposes to the robot hand 72 at a position in height of the hand section 80 of the robot hand 72 waiting in front of the receiving and transmitting stand 94.

In the next step 506, the forward end of the hand section 80 is inserted into the cutout 96 through the robot hand control system 152. At this time, the hand section 80 is inserted up to a position at which the holder 44 held by the holding member 98 is viewed to interpose between the grasping members 86, 88 as viewed in a plan view.

In the next step 508, the mechanism for vertically moving and rotating the holder 100 is driven downwardly, and attraction for the holder 44 by the hand section 80 is started through the robot hand control system 152. Accordingly, the holding member 98 is separated from the holder 44, and the holder 44 is attracted and held by the hand section 80.

In the next step 510, the robot hand 72 is moved to a position in front of the washing unit 106 through the robot hand control system 152. After that, the subroutine proceeds to a step 512 to control the robot hand 72 through the robot hand control system 152 so that the holder 44 held by the hand section 80 is moved to a position over the holder support members 122A, 122B of the holder washing unit 106.

In the next step 514, the attraction for the holder 44 by the hand section 80 is deenergized through the robot hand control system 152. After that, the subroutine proceeds to a step 516 to drive the holder support members 122A, 122B upwardly through the support member driving system 156. Accordingly, the holder 44 is supported by the underlying holder support members 122A, 122B.

In the next step 518, the robot hand 72 is controlled through the robot hand control system 152 to retract the hand section 80. After that, in a step 520, the holder support members 122A, 122B are moved downwardly through the support member driving system 156.

Figure 11:
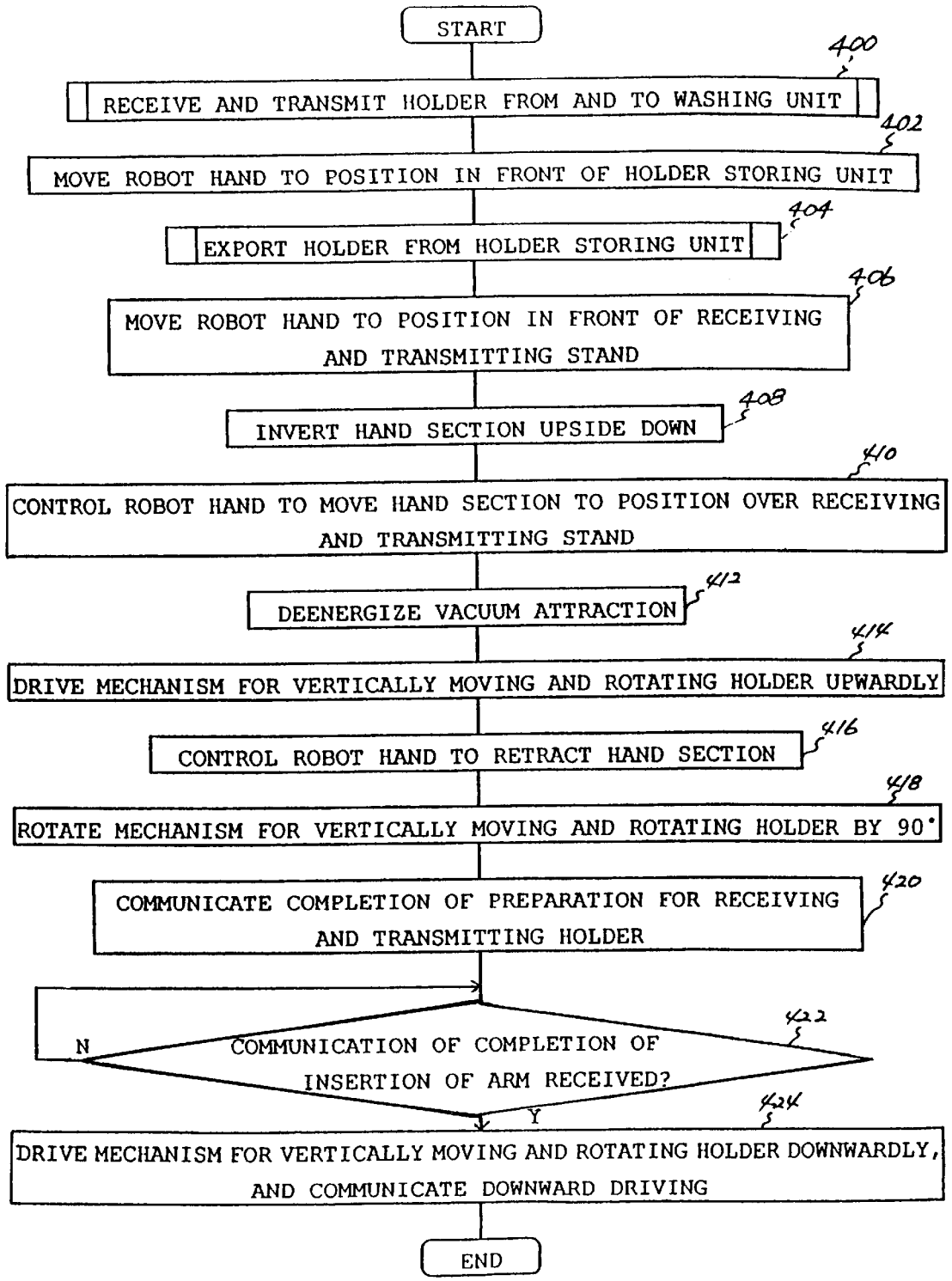
FIG. 11 shows a flow chart illustrating a principal control algorithm of a second control unit.

In the next step 522, the ultrasonic generator 124 is operated, and then the subroutine returns to a step 402 in the main routine in FIG. 11.

In the step 402, the robot hand 72 is moved to a position in front of the holder storing unit 104 through the robot hand control system 152. After that, the routine proceeds to a subroutine of "EXPORT HOLDER FROM HOLDER HOLDING UNIT" in a step 404.

Figure 13:
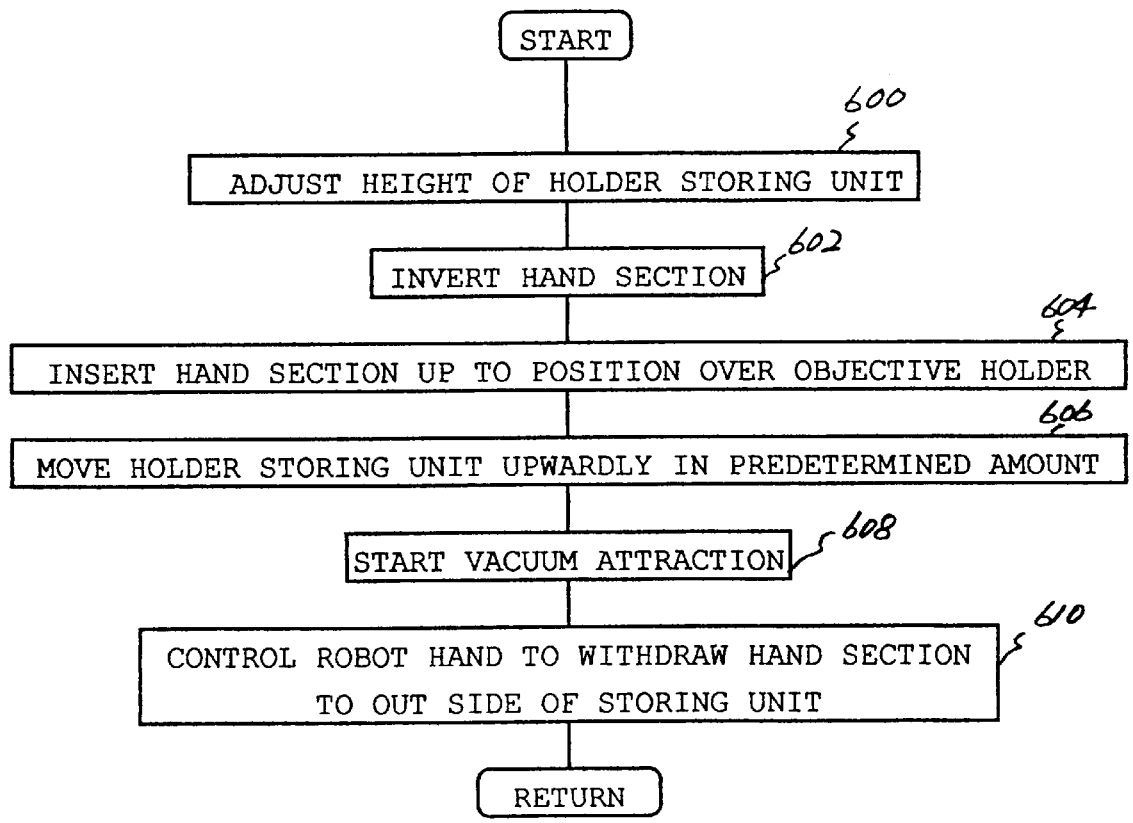
FIG. 13 shows a flow chart illustrating processing in a subroutine of "EXPORT HOLDER FROM HOLDER HOLDING UNIT" in FIG. 11.

In this subroutine, as shown in a flow chart in FIG. 13, the height of the holder storing unit 104 is adjusted through the driving mechanism 156 in a step 600. Specifically, the height of the storing unit 104 is adjusted on the basis of a counted value of the unillustrated counter which indicates a place of a holder support shelf 110 in the storing unit 104 so that a holder 44 stored on the holder support shelf 110 at a step corresponding to the counted value is disposed at a position slightly lower than a position of the hand section 80.

Figure 6A:
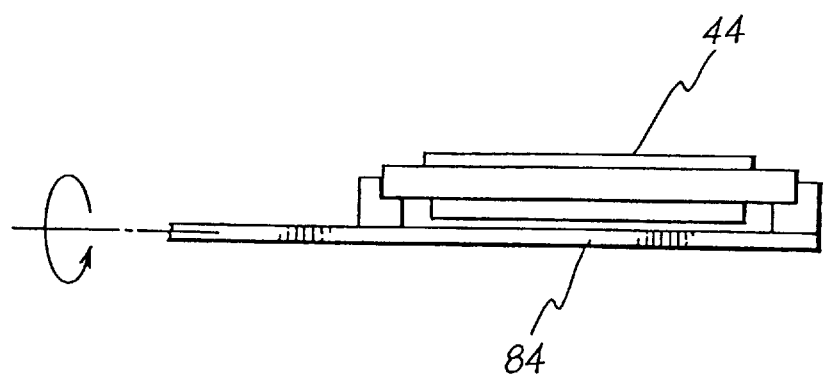
FIGS. 6A and 6B show views for explaining operation of an arm which holds a holder, the former and the latter illustrating directions of the holder before and after rotation respectively.
Figure 6B:
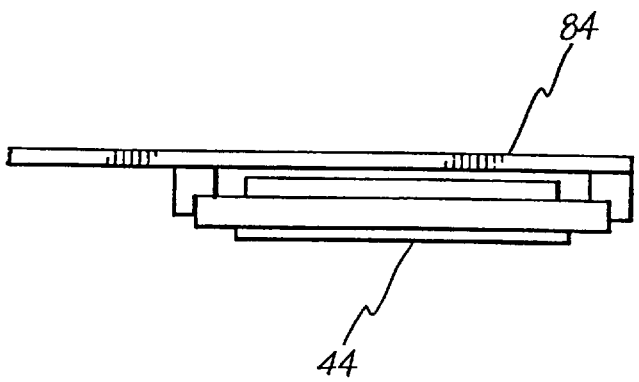

In the next step 602, the hand section 80 of the robot hand 72 is inverted upside down through the robot hand control system 152 as shown in FIGS. 6A and 6B. The subroutine proceeds to a step 604 to insert the hand section 80 up to a position over the objective holder 44 in the storing unit 104 through the robot hand control system 152. At this time, the hand section 80 is inserted up to a position which is most suitable to grasp both ends of the holder 44 by using the grasping members 86, 88.

In the next step 606, the holder storing unit 104 is driven upwardly in a predetermined amount through the driving mechanism 156. In a step 608, attraction for the holder 44 by the hand section 80 is started through the robot hand control system 152. Accordingly, the holder 44 is attracted by the hand section 80.

In the next step 610, the robot hand 72 is controlled through the robot hand control system 152 to withdraw the hand section 80 to the outside of the holder holding unit 104. After that, the subroutine returns to a step 406 of the main routine in FIG. 11.

In the step 406, the robot hand 72 is moved to a position in front of the receiving and transmitting stand 94 through the robot hand control system 152. After that, the routine proceeds to a step 408 to invert the hand section 80 upside down through the robot hand control system 152. Accordingly, the holder 44 attracted and held by the hand section 80 is inverted upside down to return to the ordinary direction.

In the next step 410, the robot hand 72 is controlled through the robot hand control system 152 to move the hand section 80 to a position over the receiving and transmitting stand 94. At this time, the hand section 80 is moved up to a position so that its forward end portion which holds the holder 44 is disposed at a position corresponding to the cutout 96 of the holder holding member 98 of the mechanism for vertically moving and rotating the holder 100 on the receiving and transmitting stand 94.

In the next step 412, the attraction for the holder 44 by the hand section 80 is deenergized through the robot hand control system 152. In a step 414, the mechanism for vertically moving and rotating the holder 100 is driven upwardly in a predetermined amount. Accordingly, the holding member 98 is raised, and the holder 44 is held by the underlying holding member 98.

In the next step 416, the robot hand 72 is controlled through the robot hand control system 152 to retract the hand section 80. After that, the routine proceeds to a step 418 to rotate the mechanism for vertically moving and rotating the holder 100 by 90 degrees in a direction opposite to the previous direction. Accordingly, the holding member 98 is rotated while holding the holder 44 to provide. a state in which the cutout 96 opposes to the transport arm 92 in the waiting position.

In the next step 420, it is communicated to the first control unit 130 that preparation for receiving and transmitting the holder 44 is completed. The routine proceeds to a step 422 to wait for communication from the first control unit 130 that insertion of the transport arm 92 is completed.

Now the explanation returns to the operation of the first control unit 130. As described above, the first control unit 130 is in the step 224 in which the routine waits for communication from the second control unit 132 that the preparation for receiving and transmitting the holder 44 is completed. When this communication is received, the judgment in the step 224 is affirmed. Thus the routine proceeds to a step 226 to insert the forward end of the transport arm 92 into the cutout 96. After that, in a step 228, it is communicated to the second control unit 132 that the insertion of the transport arm 92 into the cutout 92 is completed. After that, in a step 230, the routine waits for communication from the second control unit 132 that downward driving of the mechanism for vertically moving and rotating the holder 100 is completed.

Now the explanation temporarily returns to the operation of the second control unit 132. As described above, the second control unit 132 is in the step 422 in which the routine waits for communication that the insertion of the transport arm 92 is completed. When this communication is received, the judgment in the step 422 is affirmed. Thus the routine proceeds to a step 424 to drive the mechanism for vertically moving and rotating the holder 100 downwardly, and the downward driving is communicated to the first control unit 130. After that, the series of processing of this routine ends.

Now the explanation temporarily returns to the operation of the first control unit 130. As described above, the first control unit 130 is in the step 230 in which the routine waits for communication from the second control unit 132 that the downward driving of the mechanism for vertically moving and rotating the holder 100 is completed. When this communication is received, the judgment in the step 230 is affirmed. Thus the routine proceeds to a step 232 to start attraction for the holder 44 by the transport arm 92 through the vacuum-attracting means 142. Accordingly, the holder 44 is attracted and held by the transport arm 92.

In the next step 234, the transport arm 92 is moved to a position in front of the X stage 42 through the transport arm driving system 148. The routine proceeds to a step 236 to move the transport arm 92 to a position over the X stage 42 through the transport arm driving system 148. At this time, the transport arm 92 is moved to a position corresponding to the cutout 52 of the support member 50 of the mechanism for vertically moving the holder 144 so that the holder 44 held by the transport arm 92 is just fitted to the round hole 46 on the X stage 42.

In the next step 238, the mechanism for vertically moving the holder 144 is driven upwardly, and the attraction for the holder 44 by the transport arm 92 is deenergized. Accordingly, the support member 50 is raised to hold the holder 44 at its bottom to provide a state in which the forward end of the transport arm 92 is fitted to the inside of the cutout 52 of the support member 50.

In the next step 240, the transport arm 92 is retracted through the transport arm driving system 148. After that, the routine proceeds to a step 242 to drive the mechanism for vertically moving the holder 144 downwardly. Accordingly, the holder 44 held by the support member 50 is lowered to fit to the round hole 46 of the X stage 42.

In the next step 244, attraction for the holder 44 by the X stage is started through the vacuum chuck 140. After that, the series of processing of this routine ends. After the end, an ordinary exposure process is started again.

On the other hand, the second control unit 132 further executes the following operations. When a certain period of time has passed after the start of the ordinary exposure process, the holder 44 subjected to the washing in the water tank 118 is retrieved to the outside of the water tank 118 through the support member driving system 156 to dry the holder 44. After the drying, the robot hand 72 and the holder support members 122A, 122B are controlled through the robot hand control system 152 and the support member driving system 156 respectively to export the holder 44 after the drying from the washing unit 106 by using the robot hand 72. Upon the drying for the holder 44, a device may be provided to facilitate drying by blowing warm air on the holder 44. Alternatively, it is also possible to dry the holder 44 in the storing unit 104 described above.

Next, the second control unit 132 controls the robot hand 72 through the robot hand control system 152 so that the exported holder 44 is held by the hand section 80 and imported into the holder storing unit 104. Before the import, the second control unit 132 operates to invert the hand section 80 which holds the holder 44 upside down through the robot hand control system 152, and then it adjusts the height of the storing unit 104 through the driving mechanism 156. In this adjustment for height, the height is adjusted to be suitable to import the holder 44 into a holder support shelf 110 at a step corresponding to a counted value of the counter described above.

As clarified from the explanation described above, the holder transport system of this embodiment is constituted by the X guide 70, the robot hand 72, the Y guide 90, the transport arm 92, and the mechanism for vertically moving and rotating the holder 100.

As explained above, according to this embodiment, the dirt on the holder 44 is measured every time when a predetermined number of exposure cycles are completed. If the holder 44 is dirty, the dirty holder 44 is automatically exchanged for a clean holder 44 stored in the storing unit 104, and exposure can be restarted immediately. Accordingly, it is unnecessary to stop the apparatus for a long period of time in order to clean the holder 44. Therefore, the throughput can be greatly improved.

Moreover, a clean holder 44 can be always used to perform printing, and hence a good overlay accuracy can be maintained. Thus the yield of semiconductor is not decreased.

According to this embodiment, the cleaning operation is automated. Accordingly, it is possible to avoid the difference among individuals which would otherwise arise in the conventional manual operation, and the secondary contamination which would be caused by the manual operation. In addition, it is possible to greatly shorten the stop time of the apparatus per one day relative to the cleaning operation for the holder 44.

Further, the cleaning operation can be continued by the holder washing unit 106 in the second chamber 14 even in a period in which the exposure process for the wafer 34 is performed in the first chamber 12. Accordingly, it is unnecessary to limit the washing time, and the holder 44 can be sufficiently washed.

The holder 44 after washing is stored in the holder storing unit 10. Accordingly, when at least two holders 44 are prepared, it is possible to always maintain a clean state of the contact surface of the holder 44 to contact with the wafer 34.

In the embodiment described above, in order to avoid complication of the explanation, an example has been explained in which the wafer transport arm 92 and the robot hand 72 are used for both of transport of the dirty holder 44 and transport of the clean holder 44. However, the present invention is not limited thereto. In practice, it is desirable to provide one exclusively used for the dirty holder and one exclusively used for the clean holder for both or any one of the transport arm 92 and the robot hand 72. In such an embodiment, for example, the following operation is possible. Firstly, a first transport arm 92 exclusively used for clean holders is allowed to wait in the vicinity of the X stage 42 in a state in which the first transport arm 92 holds a clean holder 44. Secondly, if the dirt on a holder 44 is measured, a second transport arm 92 exclusively used for dirty holders is immediately used to receive a dirty holder 44 disengaged from the X stage 42 by the mechanism for vertically moving the holder 144. Finally, the clean holder 44 held by the first transport arm 92 exclusively used for clean holders is approximately simultaneously transmitted to the mechanism for vertically moving the holder 144 to install the clean holder 44 onto the X stage 42. Such an embodiment avoids a fear that contaminants from the dirty holder 44 would adhere to the clean holder 44 through the transport arm 92 or the robot hand 72.

In the embodiment described above, an example has been explained in which the holder washing unit 106 is provided together with the holder storing unit 104. However, the holder can be always kept clean even by providing any one of them. For example, when only the holder storing unit 104 is provided, a large number of clean holders 44 may be previously stored in the storing unit 104, and dirty holders 44 may be exported to the outside to perform a cleaning operation at the outside. Alternatively, when only the holder washing unit 106 is provided, it is necessary to interrupt the exposure operation during washing of the holder 44. However, the interrupting time for the exposure operation is short as compared with the conventional manual operation. Moreover, the holder 44 is washed reliably. Accordingly, various problems arisen by the manual operation can be solved.

Second Embodiment

Figure 14:
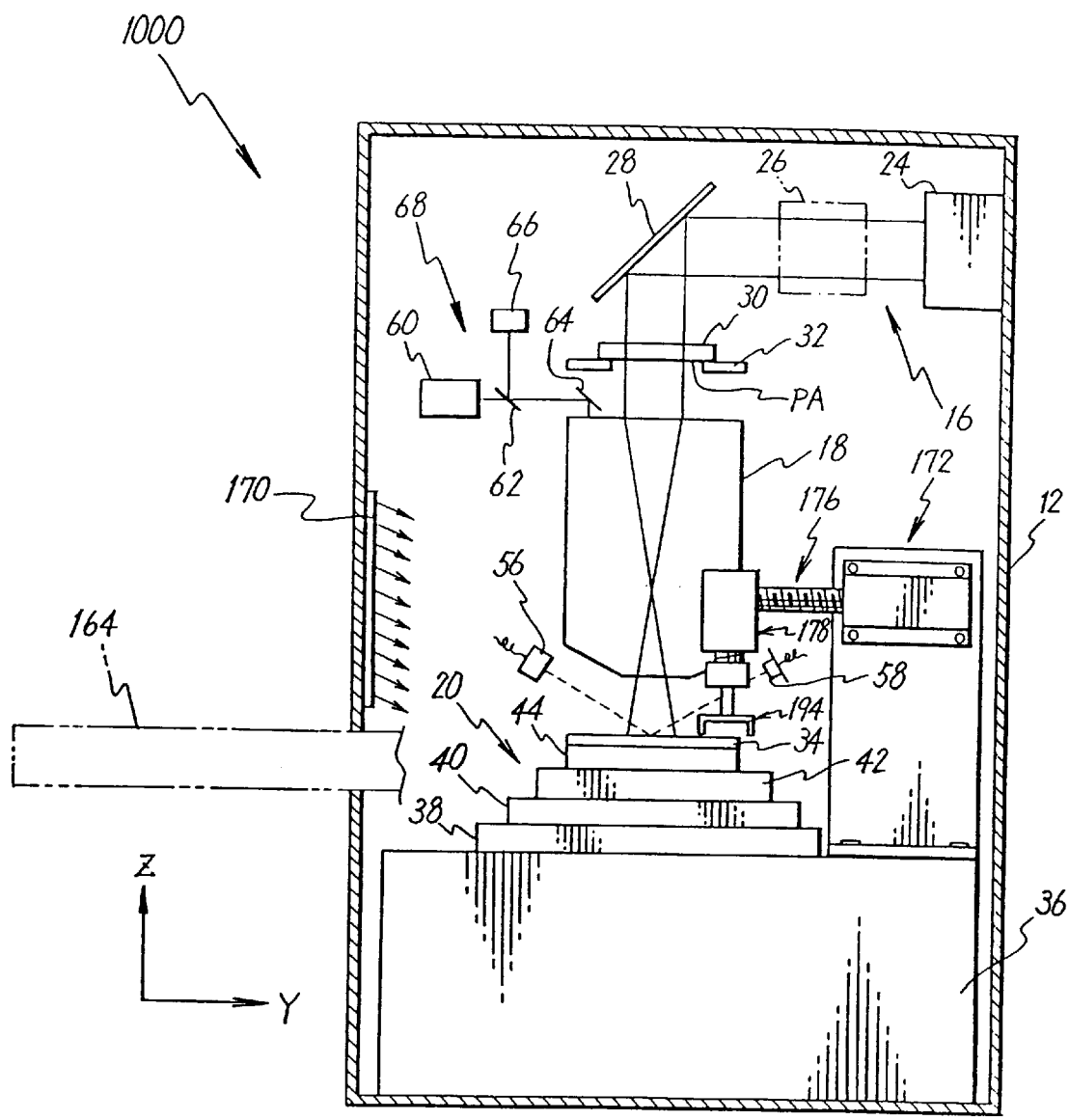
FIG. 14 shows a schematic vertical cross-sectional view illustrating an exposure apparatus according to a second embodiment of the present invention.
Figure 15:
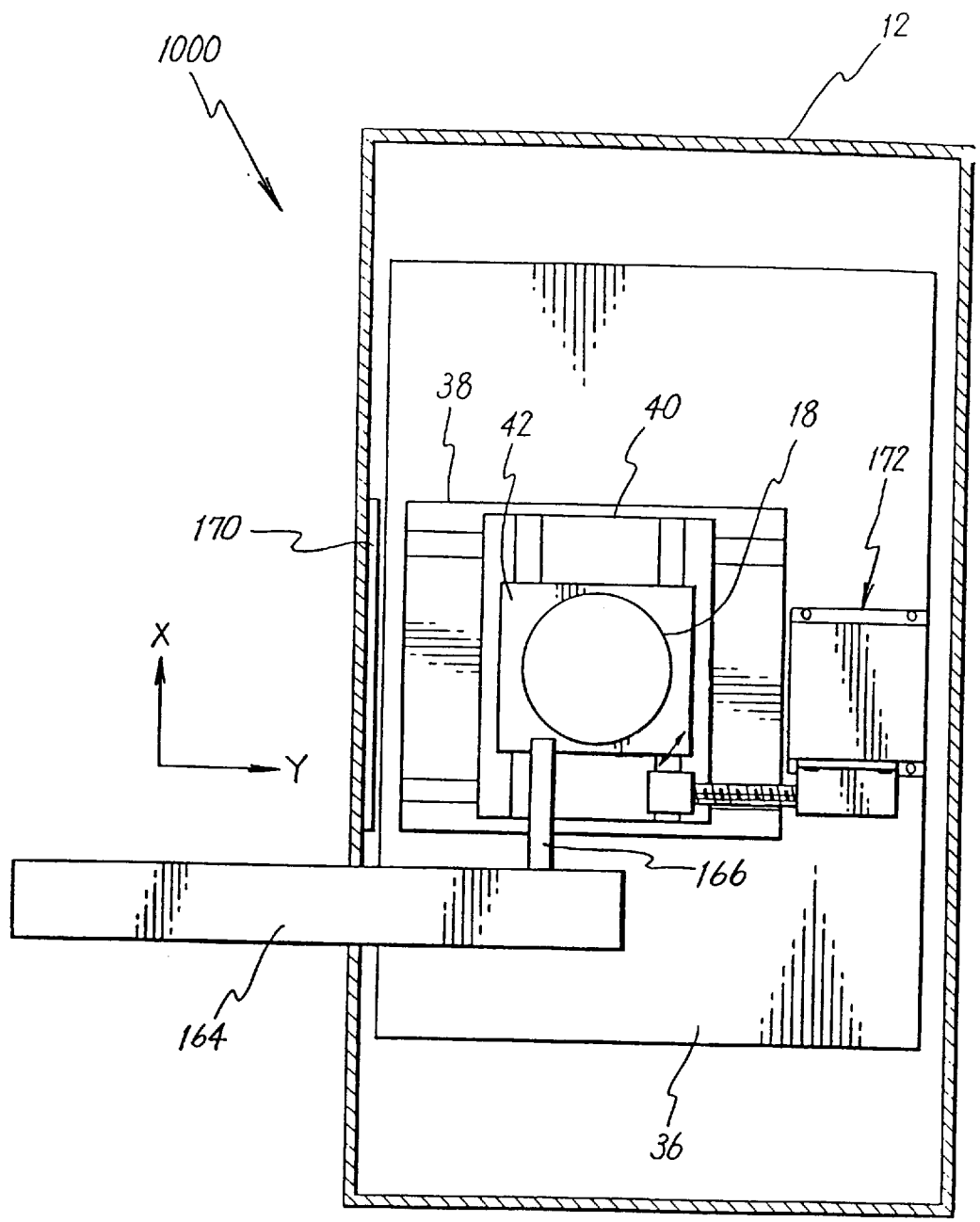
FIG. 15 shows a schematic lateral cross-sectional view of the apparatus shown in FIG. 14.

A second embodiment of the present invention will be explained below with reference to FIG. 14 to FIG. 21. FIGS. 14 and 15 schematically show an entire arrangement of an embodiment of an exposure apparatus 1000 to which a cleaning unit according to the fourth aspect of the present invention is applied. FIG. 14 shows a schematic vertical cross-sectional view of the exposure apparatus 1000. FIG. 15 shows a schematic lateral cross-sectional view of the exposure apparatus 1000.

The exposure apparatus 1000 includes a chamber 12 for protecting the apparatus 1000 from dust. A constant temperature and a constant humidity are maintained in the chamber 12. The chamber 12 is controlled so that its interior always has a set temperature, for example, 23° C. with fluctuation of ±0.1° C. The chamber 12 is only provided with doors which are necessary and minimum for IC production operations and maintenance for the apparatus. The chamber 12 is covered with another chamber (not shown).

The chamber 12 accommodates an irradiation optical system 16 for providing an exposure light beam, a projection optical system 18, an XY stage unit 20, an AF system (irradiation optical system 56, light-collecting optical system 58), an alignment sensor 60, an interferometer system 62 and so on. These components are similar to those used in the exposure apparatus described in relation to FIGS. 1 and 2. Accordingly, explanation for them is omitted.

The chamber 12 has a left side wall as shown in FIGS. 14 and 15. A Y guide 164 is provided therethrough, which extends in the Y direction in a state of penetration through the left side wall. A wafer transport arm 166 (hereinafter referred to as "transport arm") is attached to the Y guide 164. The transport arm 166 is constructed so that it is movable along the Y guide 164, and movable in the X direction within a predetermined distance range. The transport arm 166 may be constructed in the same manner as the transport arm 92 used in the first embodiment. The transport arm 166 is provided with an attracting means 168 (see FIG. 19) for attracting a wafer. In this embodiment, the Y guide 164, the transport arm 166, and the mechanism for vertically moving the wafer 146 described above (see FIG. 3) constitute a wafer transport system. The wafer transport system also functions as "a transport system for transporting a cleaning member (whetstone) and receiving and transmitting the cleaning member from and to a substrate holding member (holder)".

Only an opening having a size corresponding to the Y guide 164 and the transport arm 166 is formed through the left side wall of the chamber 12 in FIGS. 14 and 15. A HEPA filter (high efficiency particulate air filter) 170 is installed on the left side wall as shown in FIGS. 14 and 15. Clean air flowing into the inside through the HEPA filter 170 flows toward the projection optical system 18.

In this embodiment, a whetstone driving unit 172 is installed on a right side (side opposite to the HEPA filter 170) with respect to the base 38 on the pedestal 36 in FIG. 14. As shown in an enlarged view in FIG. 16, the whetstone driving unit 172 comprises a main body 174, a horizontal driving system 176 as a horizontal movement means, and a vertical driving system 178 as a vertical movement means.

The whetstone driving unit 172 will be described in detail below. The main body 174 is box-shaped, and an unillustrated motor control system (see FIG. 19) is accommodated therein. A first motor accommodating section 182, which is also box-shaped, is provided on a frontward side of the main body 174 as viewed with respect to the plane of paper in FIGS. 14 and 16. The horizontal driving system 176 is constituted by a first motor (not shown) accommodated in the first motor accommodating section 182, and a first feed screw 184 driven and rotated by the first motor. A second motor accommodating section 186, which is movable in the Y direction (right and left directions in FIGS. 14 to 16) in accordance with rotation of the first feed screw 184, is attached to a forward end of the first feed screw 184. A second motor (not shown) for driving a second feed screw 188 is accommodated in the second motor accommodating section 186. The vertical driving system 178 is constituted by the second motor and the second feed screw 188.

Figure 16:
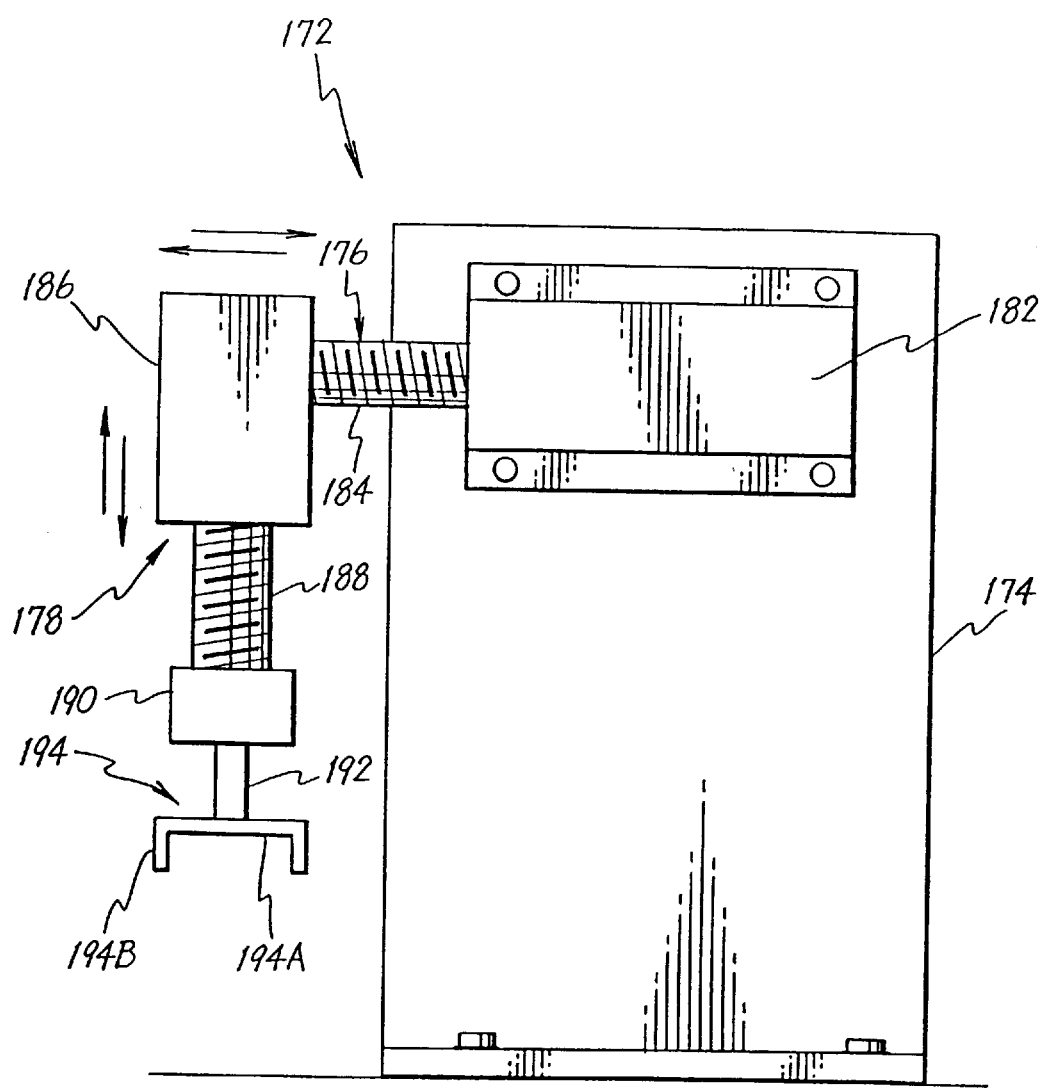
FIG. 16 shows an enlarged whetstone driving unit shown in FIG. 14.

In order that the second motor accommodating section 186 does not protrude in a predetermined amount or more toward the left side in FIGS. 14 to 16, the first motor accommodating section 182 contains an electric limit switch comprising a photosensor or the like for limiting the driving amount of the first feed screw 184, and a stopper as a mechanical limit means for forcibly stopping driving of the feed screw 184 if the limitation by the electric limit switch does not function. These components are provided for countermeasure against crash of the first motor. Certain similar limit mechanism is also provided in the second motor accommodating section 186 to prevent the second motor from crash.

A shaft 192, and a rotary driving means 190 for rotating an engaging arm 194 as an engaging member integrally provided at a forward end of the shaft 192 are provided at a forward end (lower end) of the second feed screw 188. The rotary driving means contains a third motor (not shown) for rotating the shaft 192.

The engaging arm 194 comprises an arm 194A secured horizontally to a forward end (lower end) of the shaft 192, and a pair of pawls 194B provided vertically downwardly at both ends of the arm 194A. The pawls 194B have a circular cross section in this embodiment, however, they may have a rectangular cross section or other shapes.

The driving unit 172 is constituted as described above. Accordingly, when the pawls 194B of the engaging arm 194 engage with a whetstone 196 as described below, the whetstone 196 is rotated on the holder 44 integrally with the engaging arm 194 by means of the rotary driving means 190.

Figure 17A:
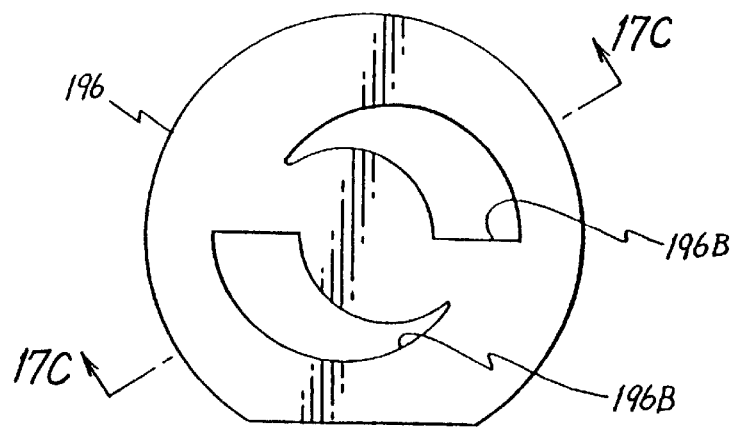
FIG. 17A is a plan view of a whetstone.
Figure 17B:
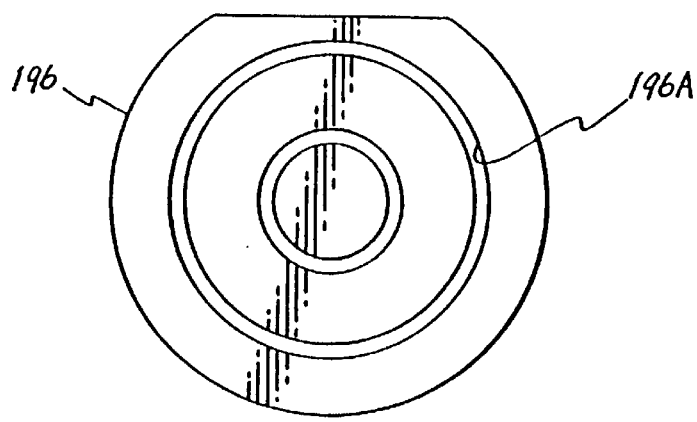
FIG. 17B is a bottom view of the whetstone.
Figure 17C:
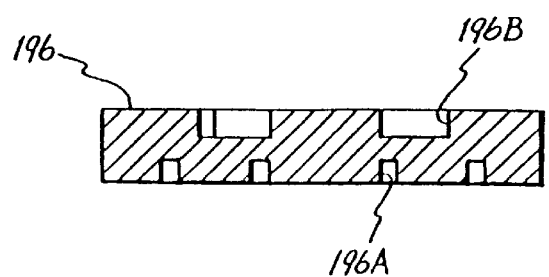
FIG. 17C is a cross-sectional view taken along a line C—C in FIG. 17A.

Next, the whetstone for cleaning the holder will be explained with reference to FIG. 17. FIG. 17A shows a plan view of the whetstone 196, FIG. 17B shows a bottom view, and FIG. 17C shows a cross-sectional view taken along a line C—C in FIG. 17A.

The whetstone 196 is formed of a porous material (for example, alumina ($Al_2O_3$), white ceramics, Arkansas stone, $TiO_2$, $ZrO_2$, ruby, Altec, etc.) . The whetstone 196 has a general shape similar to a shape of a wafer having an orientation flat as if the shape is obtained by linearly cutting a part of a disk. As for the size of the whetstone 196, it has a size of about 70 to 80% of the holder 44. Accordingly, the whetstone 196 can be transported by using the wafer transport system described above. As shown in FIG. 17B, a plurality of concentric grooves 196A are formed on a bottom surface (surface on a side to contact with the holder 44) of the whetstone 196 in the same manner as the holder 44. As shown in FIG. 17A, a pair of recessed grooves 196B, which are point-symmetrical with respect to a center of the whetstone 196, are formed on an upper surface (surface on a side opposite to the side to contact with the holder 44) of the whetstone 196. Each of the recessed grooves 196B has a shape so that the opening width in the radial direction progressively narrows in accordance with counterclockwise rotation. Such a shape is provided in order to realize the following function. Namely, as shown by an arrow A in FIG. 18A, the engaging arm 194 is lowered from an upper position, and forward ends of the pawls 194B are inserted into portions of the recessed grooves 196B having a wide opening width. In this state, the engaging arm 194 is rotated about a center of an axis B in a direction of an arrow $\theta_1$. Thus the pawls 194B are fitted to portions of the recessed grooves 196B having a narrow opening width, and the engaging arm 194 easily engages with the whetstone 196. If the engaging arm 194 is rotated in a direction opposite to the direction of the arrow $\theta_1$, the engagement between the engaging arm 194 and the whetstone 196 is released. The engagement between the engaging arm 194 and the whetstone 196 (recessed grooves 196B) is also released by raising the engaging arm 194.

Figure 19:
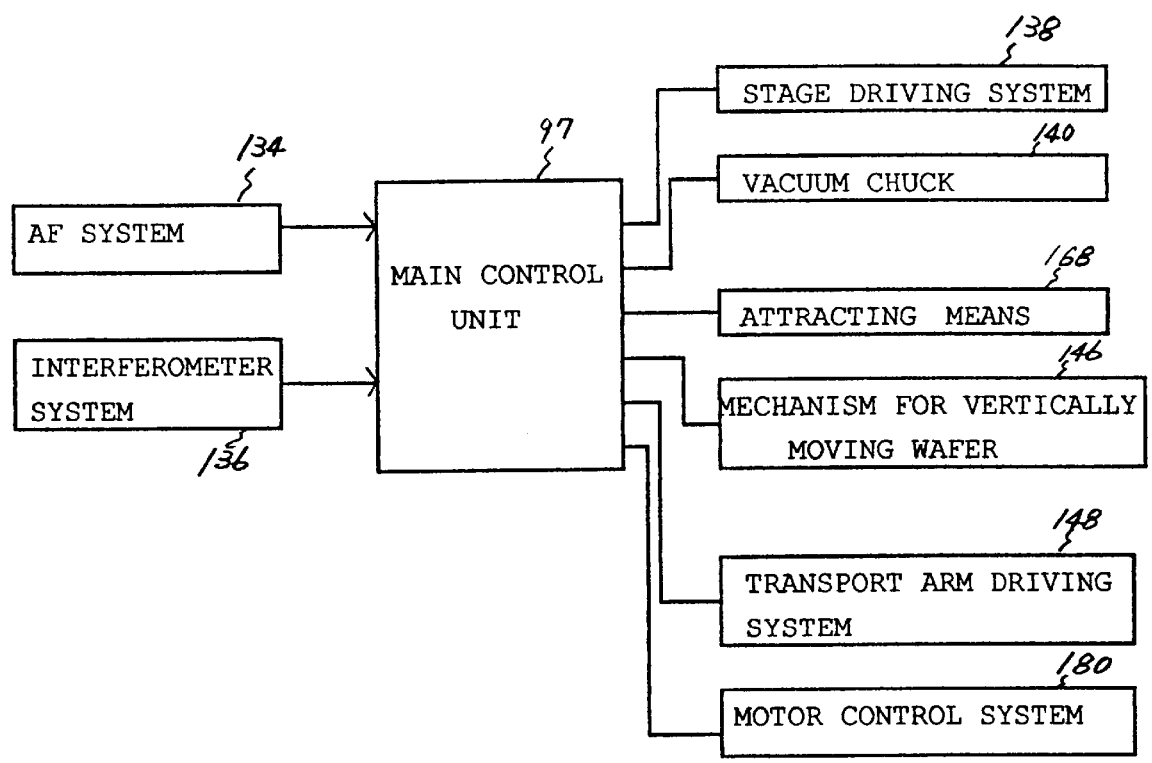
FIG. 19 shows a block diagram illustrating a schematic arrangement of a control system of the apparatus shown in FIG. 14 in relation to holder cleaning.

Next, explanation will be made for a control system relating to cleaning of the holder, the control system constituting the exposure apparatus 1000. As shown in FIG. 19, the control system is principally constituted by a main control unit 97 comprising a microcomputer or a minicomputer. An AF system 134 and an interferometer system 136 are connected to an input side of the main control unit 97. Connected to an output side of the main control unit 97 are a stage driving system 138, a vacuum chuck 140, an attracting means 168, a mechanism for vertically moving the wafer 146, a transport arm driving system 148, and a motor control system 180. In this embodiment, the stage driving system 138 comprises unillustrated feed screws, motors and so on for driving the X stage 42 and the Y stage respectively. The stage driving system 138 drives the X stage 42 and the Y stage 40 so that the holder 44 on the X stage is driven two-dimensionally. The transport arm driving system 148 is provided at the Y guide 164 described above. The transport arm driving system 148 comprises a feed screw, a motor and so on (not shown) for driving the transport arm 166 along the Y guide 164.

Figure 20:
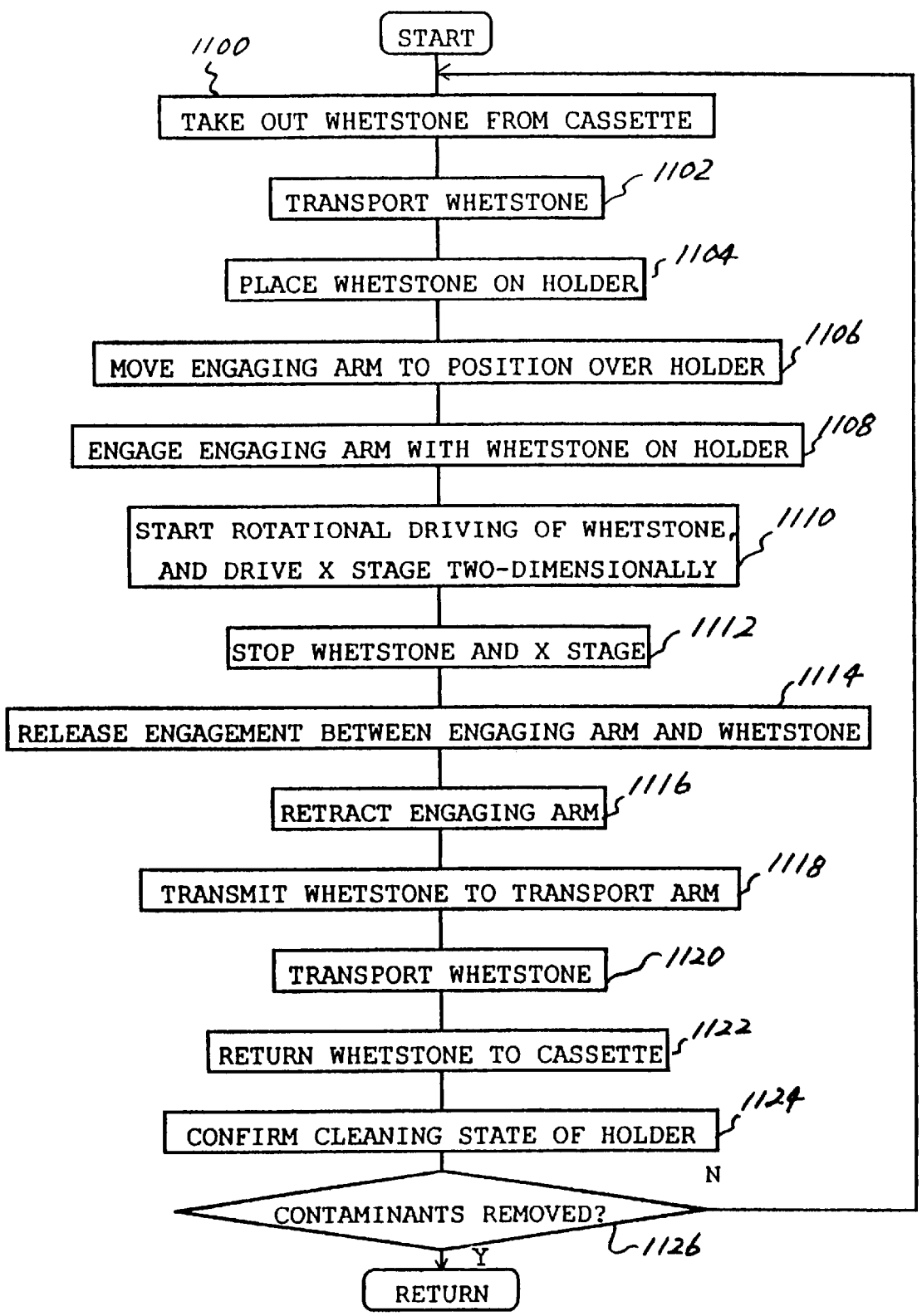
FIG. 20 shows a flow chart illustrating a principal control algorithm of a main control unit.

Next, a holder cleaning process according to this embodiment constituted as described above will be explained with reference to a flow chart in FIG. 20 which illustrates a principal control algorithm of the main control unit 97. The control algorithm automatically starts at a point of time when a preset predetermined number of exposure process cycles are completed. In another case, the control algorithm also starts when exposure failure occurs due to defective wafer flatness or the like during an exposure process, an unillustrated cleaning start button is depressed by an operator, and a cleaning start command is inputted into the main control unit 97. It is premised that the X stage 42 and the Y stage 40 wait at predetermined waiting positions (positions at which an upper-left corner of the X stage 42 in FIG. 15 is disposed at a position under the projection optical system 18, and the holder 44 is disposed at a position spaced apart from the projection optical system 18 obliquely downwardly in FIG. 15), and the wafer 34 on the holder 44 is unloaded.

In a step 1100, a whetstone is taken out from an unillustrated cassette. Specifically, a forward end of the transport arm 166 is inserted into the cassette through the transport arm driving system 148. The attracting means 168 provided on the transport arm 166 is operated to attract and hold the whetstone 196 in the cassette. In this state, the forward end of the transport arm 166 is ejected to the outside of the cassette to export the whetstone 196.

In the next step 1102, the transport arm 166 which holds the whetstone 196 is driven along the Y guide 164 through the transport arm driving system 148. Thus the whetstone 196 is transported to a position in front of the holder 44.

In the next step 1104, the whetstone 196 is placed on the holder 44. Specifically, the transport arm 166 is controlled through the transport arm driving system 148 so that the whetstone 196 attracted and held by the transport arm 166 is once moved to a position over the holder 44. The mechanism for vertically moving the wafer 146 is controlled for its ascending movement so that the mechanism for vertically moving the wafer 146 holds the whetstone 196 at its bottom. The attracting means 168 is stopped to deenergize the attraction for the whetstone 196 by the transport arm 166. After that, the mechanism for vertically moving the wafer 146 is controlled for its descending movement so that the whetstone 196 is placed on the holder 44.

In the next step 1106, the first motor is driven through the motor control system 180 so that the rotary driving means 190 and the engaging arm 194 are integrally moved horizontally to a position over the holder 44.

In the next step 1108, the engaging arm 194 is allowed to engage with the whetstone 196 placed on the holder 44. Specifically, the second motor is driven through the motor control system 180. The rotary driving means 190 and the engaging arm 194 are integrally lowered in the vertical direction until the pair of pawls 194B at the forward ends of the engaging arm 194 are inserted into the pair of recessed grooves 196B on the upper surface of the whetstone 196. After that, the second motor is stopped. FIG. 18 (A) shows a state in which the pawls 194B of the engaging arm 194 are inserted into the recessed grooves 196B on the upper surface of the whetstone 196. Subsequently, the third motor is driven through the motor control system 180 to rotate the engaging arm 194 relatively slowly in the predetermined direction ($\theta_1$ direction). Accordingly, the pawls 194B engage with the recessed grooves 196B of the whetstone 196 as described above. After completion of the engagement between the pawls 194B and the recessed grooves 196B, the second motor is driven to apply a predetermined load to the whetstone 196.

Figure 18A:
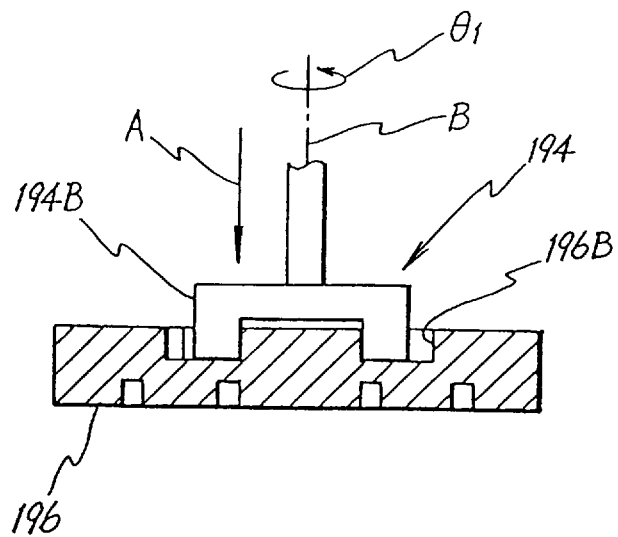
FIGS. 18A and B show views for explaining operation of an engaging arm and a whetstone upon engagement.
Figure 18B:
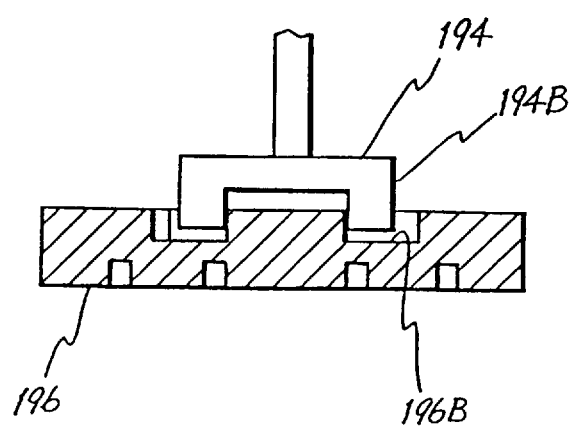

In this embodiment, when the engaging arm 194 is engaged with the whetstone 196, the rotation angle of the engaging arm 194 is adjusted by driving the third motor previously or during descending movement of the engaging arm 194 so that the forward ends of the pawls 194B do not contact with portions other than the recessed grooves 196B of the whetstone 196, and that the forward ends of the pawls 194B correspond to portions of the recessed grooves 196B having a wide opening width. When the whetstone needs no application of load, as shown in FIG. 18B, the third motor may be driven through the motor control system 180 to rotate the engaging arm 194 relatively slowly in the $\theta_1$ direction in a state in which the forward ends of the pawls 194B float in the recessed grooves 196B so that the pawls 194B engage with the recessed grooves 196B.

In the next step 1110, the third motor is driven through the motor control system 180 to start rotational driving of the whetstone 196. Simultaneously, the X stage 42 is driven two-dimensionally through the stage driving system 138. At this time, the X stage 42 is driven within a range to allow the whetstone 196 to contact with the entire surface of the holder 44.

When the cleaning is completed as described above, the rotational driving of the whetstone 196 and the movement of the X stage 42 are stopped in a step 1112. The routine proceeds to a step 1114 to release the engagement between the engaging arm 194 and the whetstone 196. Specifically, the second motor is driven in a predetermined amount in a direction opposite to the previous direction through the motor control system 180 to lift the engaging arm 194 a little. In this state, the third motor is driven slowly in a direction opposite to the previous direction through the motor control system 180. Accordingly, the engagement between the engaging arm 194 and the recessed grooves 196B is released.

In the next step 1116, the engaging arm 194 is retracted. Specifically, the second motor and the first motor are successively driven and rotated in directions opposite to the previous directions through the motor control system 180. Accordingly, the engaging arm 194 and the rotary driving means 190 are raised. Thus the second feed screw 188 is accommodated in the second motor accommodating section 186. After that, the first feed screw 184 is accommodated in the first motor accommodating section 182.

In the next step 1118, the whetstone 196 is transmitted to the transport arm 166. Specifically, the transport arm 166 is moved to a position over the holder 44 through the transport arm driving system 148, and the attracting means 168 is operated. In this state, the mechanism for vertically moving the wafer 146 is controlled for its ascending movement to lift the whetstone 196 up to the position of the transport arm 166. Accordingly, the whetstone 196 is attracted and held by the attracting means 168. After that, the mechanism for vertically moving the wafer 146 is controlled for its descending movement.

In the next step 1120, the whetstone 196 is transported to a position in front of the cassette (not shown). Specifically, the transport arm 166 which attracts and holds the whetstone 196 is driven through the transport arm driving system 148 along the Y guide 164 to a position in front of the cassette. In the next step 1122, the whetstone 196 is returned to the cassette. After that, the routine proceeds to a subroutine of "CONFIRM CLEANING STATE OF HOLDER" in a step 1124.

Figure 21:
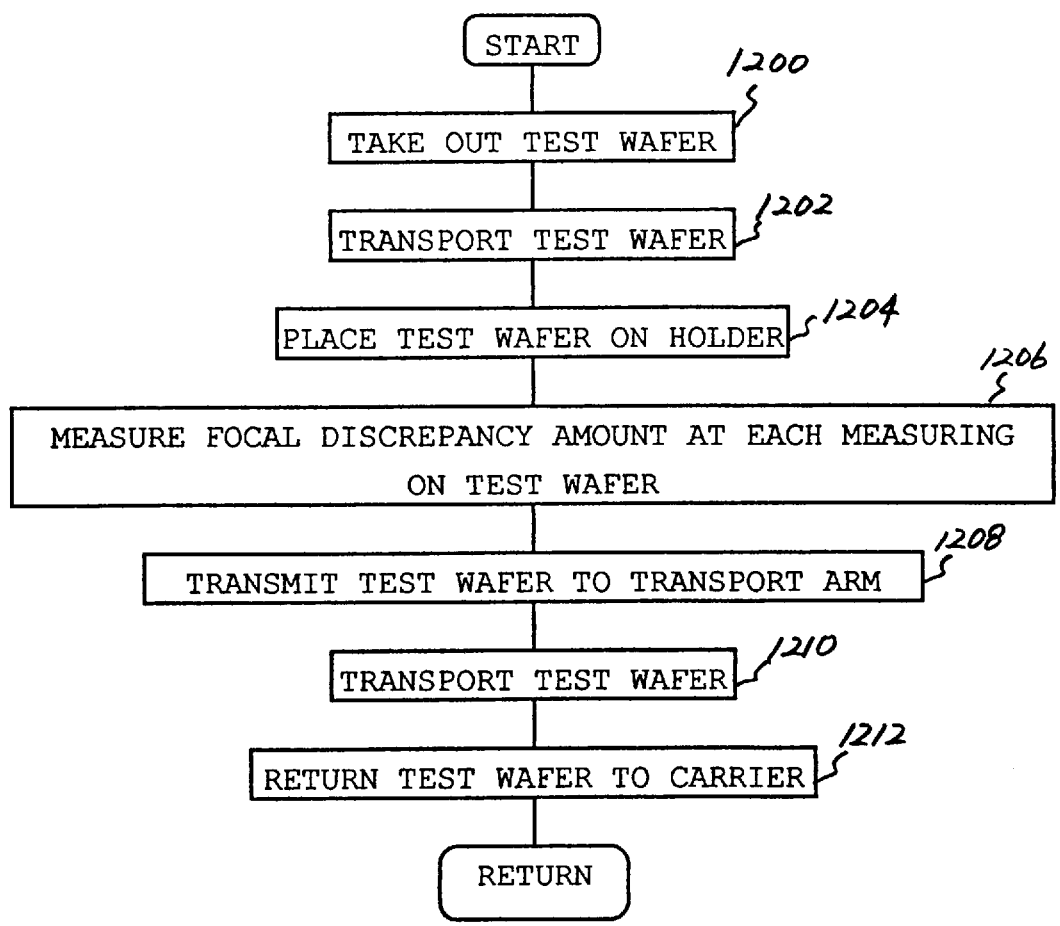
FIG. 21 shows a flow chart illustrating a subroutine of "CONFIRM CLEANING STATE OF HOLDER" in FIG. 20.

This subroutine proceeds as shown in a flow chart in FIG. 21. In a step 1200, a test wafer is taken out from an unillustrated wafer carrier. The test wafer it taken out in the same manner as the step 1100 described above to take out the whetstone. In this embodiment, a wafer having a high flatness is used as the test wafer in the same manner as the use in the first embodiment.

In the next step 1202, the test wafer is transported. The test wafer is transported by the transport arm 66 in the same manner as the step 1102 described above to transport the whetstone.

In the next step 1204, the test wafer is placed on the holder 44. The test wafer is placed on the holder in the same manner as the step 1104 described above to place the whetstone on the holder. After the test wafer is placed on the holder 44, the vacuum chuck 140 is energized to attract the test wafer onto the holder 44.

In the next step 1206, the focal discrepancy amount is measured at respective measuring points on the test wafer, and obtained results are stored in a memory. The measurement is performed by monitoring the output from the AF system 134 for predetermined measuring points (at least one point is set for each of measuring areas) while moving the X stage 42 through the stage driving system 148.

After completion of the measurement for the focal discrepancy amount, the test wafer is transmitted to the transport arm in a step 1208. Processing in the step 1208 is executed in the same manner as the processing in the step 1118 described above.

In steps 1210 to 1212, the test wafer is transported in the same manner as the steps 1120 to 1122 described above, and then the test wafer is returned to the wafer carrier. After that, the processing in this subroutine is completed to return to a step 1126 of the main routine.

In the step 1126, it is judged whether or not contaminants are removed. This judgment is made as follows. Namely, the judgment is made on the basis of the focal discrepancy amount at each of the measuring points stored in the memory in the step 1206 to judge whether or not the flatness of each of predetermined measuring areas on the wafer (which mean divided areas that are the same as shot areas in the following explanation) is within a range of allowable value. Strictly speaking, the flatness represents the degree of parallelism between the image formation plane of the projection optical system and the surface of a predetermined measuring area).

For example, when three or more measuring points are set for each of measuring areas, it is possible to judge whether or not image formation failure occurs in a measuring area by determining inclination of the area on the basis of focal discrepancy amounts of three selected measuring points, and judging whether or not the entire area is within a predetermined focal depth on the basis of the inclination and a dimension of the measuring area. Alternatively, for example, when one measuring point (central point of an area) is set for each of measuring areas, it is possible to judge whether or not image formation failure occurs in a measuring area by calculating and determining focal discrepancy amounts of at least three end points of the objective area on the basis of focal discrepancy amounts of measuring points in at least three adjacent areas, determining inclination of the area on the basis of the focal discrepancy amounts of the three points, and judging whether or not the entire area is within a predetermined focal depth on the basis of the inclination and a dimension of the measuring area.

If the judgment in the step 1126 is negated, the routine returns to the step 1100 to repeat the processing and the judgment as described above. On the other hand, if the judgment in the step 1126 is affirmed, the series of processing of this routine ends.

As explained above, according to this embodiment, contaminants on the holder 44 are cleaned by driving and rotating the whetstone 196 on the holder 44, and moving the X stage 42 two-dimensionally during the rotation of the whetstone 196. Accordingly, it is possible to expect a powerful cleaning effect, and it is possible to remove any contaminant difficult to be removed by the conventional technique. The whetstone 196 is placed on the holder 44 only during the period of cleaning, and it is transported away by the transport arm 166 to the outside of the chamber 12 during all periods other than the above. Accordingly, it is possible to avoid secondary dust release which would be caused if the whetstone 196 with grime adhered upon cleaning is left to stand in the chamber 12. The whetstone 196 is stored in the external cassette during the period other than the period of cleaning. Accordingly, the whetstone 196 can be exchanged without stopping the apparatus at all.

In this embodiment, owing to the automation of the cleaning for the holder 44, the operation can be always performed under a constant condition either when the cleaning is performed at every certain interval or when a defective product is produced due to adhesion of contaminants to the holder 44 on account of any cause. Accordingly, it is possible to avoid dispersed results of operation due to difference among individual operators. Moreover, the automation to avoid manual operation provides an effect to restrain dust release. Especially, if a contaminant suddenly adheres to the holder 44 to cause image formation failure, it is unnecessary for an operator to go to the place of the apparatus directly and perform the cleaning operation, which would be necessary in the conventional art. Accordingly, it is possible to shorten the stop time of the apparatus. Moreover, it is enough for an operator to depress the button for starting the cleaning. Accordingly, good operability is provided.

Since the whetstone 196 is formed of a porous material, contaminants such as grime removed from the surface of the holder 44 by the rotation of the whetstone are incorporated into pores formed on the surface of the whetstone 196. Accordingly, it is possible to avoid scattering of contaminants during the cleaning.

In the embodiment described above, an example has been explained in which the apparatus automatically makes the judgment on removal of contaminants. However, for example, an operator may be informed of completion of the cleaning, and the operator may make a judgment on removal of contaminant by his own eyes. In such an embodiment, for example, when contaminants adhere to places having little influence on exposure, the exposure can be continued in accordance with the judgment by the operator without performing repeated cleaning for the wafer holder. Accordingly, it is possible to avoid unnecessary decrease in throughput.

Alternatively, a predetermined limit may be provided for the number of repeating cycles of automatic cleaning. During cycles within the limit, the automatic judgment on contaminant removal and the automatic cleaning may be repeatedly carried out. When the number of cycles exceeds the limit, the contaminant removal may be judged by operator's eyes. By doing so, for example, when any contaminant is present at a place on the holder at which the contaminant is difficult to be removed by the automatic cleaning, the operator can manually clean only such a place quickly. Accordingly, it is possible to avoid useless repetition of automatic cleaning.

In order to avoid floating of contaminants in the apparatus, which would not adhere to the whetstone 196 during holder cleaning or transport of the whetstone i96, the environment in the apparatus may be always maintained in a clean state by providing an air drawing port in the vicinity of the holder, and drawing floating contaminants. Such an arrangement will be described below as a third embodiment.

Third Embodiment

Figure 22:
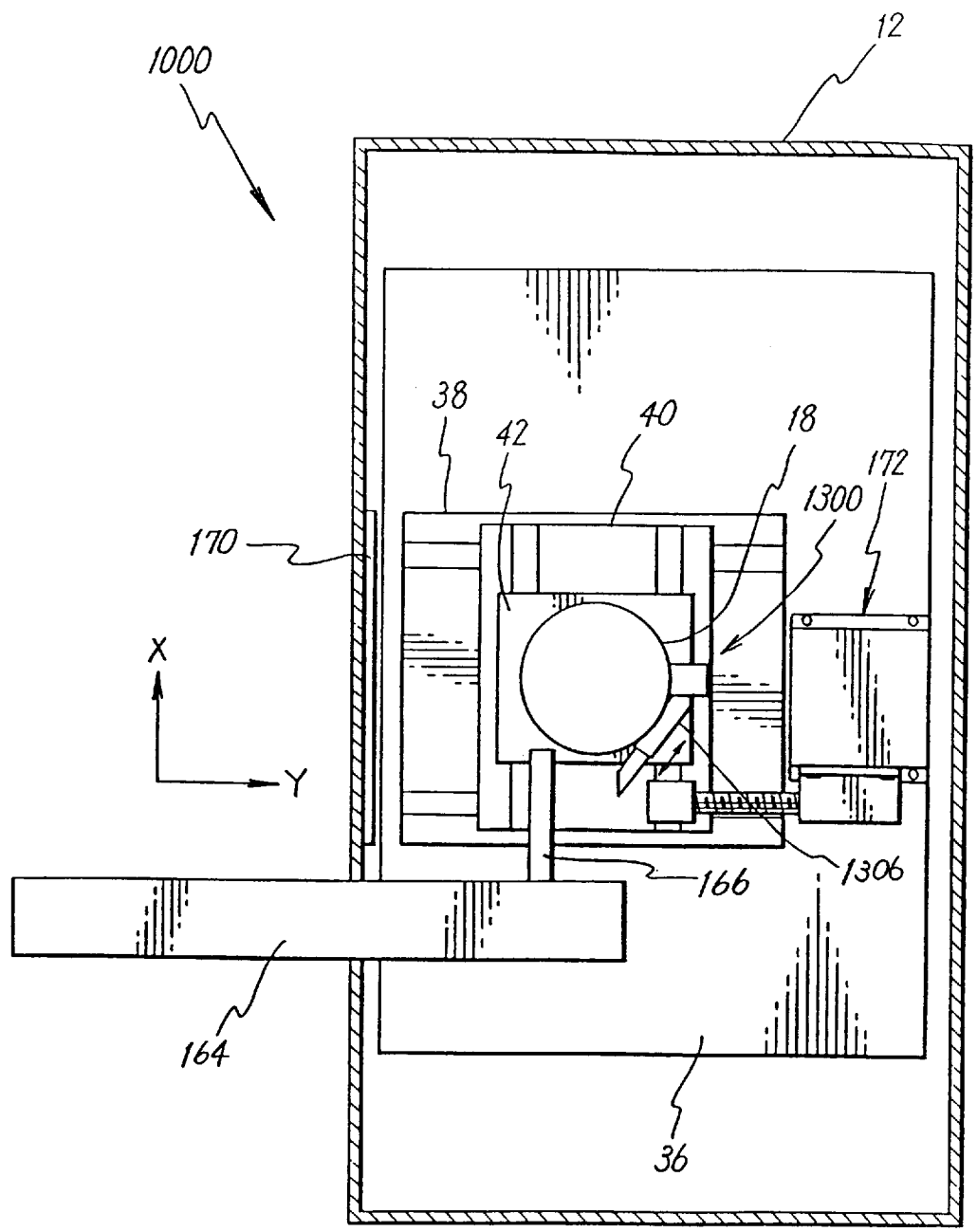
FIG. 22 shows a schematic lateral cross-sectional view illustrating an exposure apparatus according to a third embodiment of the present invention.

The third embodiment of the present invention will be explained below with reference to FIGS. 22 to 26. The third embodiment provides an example in which a mechanism for drawing contaminants emerged upon cleaning for a holder by a whetstone is applied to the exposure apparatus 1000 shown in FIGS. 14 and 15. A schematic vertical cross-sectional view of the exposure apparatus 1000 is similar to FIG. 14. FIG. 22 shows a schematic lateral cross-sectional view.

In the exposure apparatus 1000, a chamber 12, an irradiation optical system 16 for providing an exposure light beam, a projection optical system 18, an XY stage unit 20, an AF system (irradiation optical system 56, light-collecting optical system 58), an interferometer system 62, an alignment sensor 60, a whetstone driving unit 172, a transport arm 166, and a whetstone 96 are similar to those explained in the first and second embodiments. Accordingly, explanation for them is omitted. The transport arm 166 and the mechanism for vertically moving the wafer 146 described above constitute "a movement means for placing a cleaning member (whetstone) on a substrate holding member (holder) and retracting the cleaning member from the substrate holding member". The whetstone driving unit constitutes a cleaning means.

Figure 23:
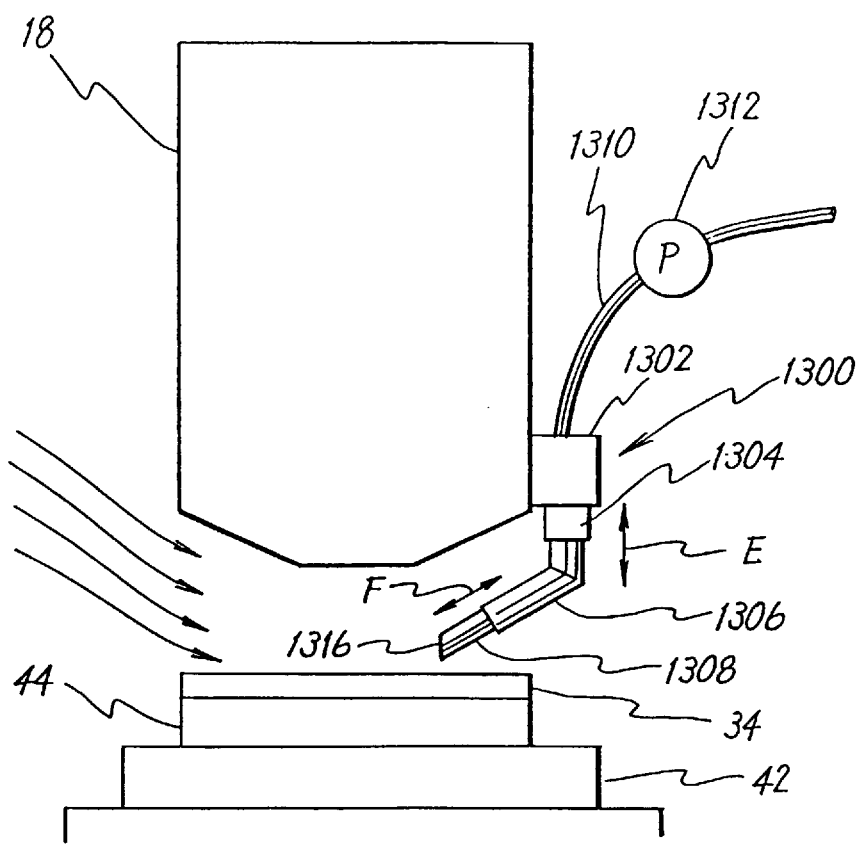
FIG. 23 shows a drawing means together with an X stage and a projection optical system of the exposure apparatus according to the third embodiment.

In this embodiment, a drawing device 1300 as shown in FIG. 23 is provided on a side surface of the projection optical system 18 (more particularly on a side surface of a lens barrel). The drawing device 1300 comprises an attachment section 1302 attached to the side surface of the projection optical system 18, a first cylindrical member 1304 provided to protrude downwardly from the attachment section 1302, a second cylindrical member 1306 having an angled shape with its one end slidably inserted into the first cylindrical member 1304, a third cylindrical member 1308 slidably inserted into the other end of the second cylindrical member 1306, and a suction pump 1312 connected to the internal space of the attachment section 1302 through a piping 1310. The attachment section 1302 contains a driving mechanism 1314 (see FIG. 24) for driving the second cylindrical member 1306 in a direction of an arrow E (vertically) and driving the third cylindrical member 1308 in a direction of an arrow F (obliquely upwardly and downwardly). Namely, the second and third cylindrical members 1306, 1308 have an expandable or contractible structure like a radio antenna of an automobile. The driving mechanism 1314 used in this embodiment comprises, for example, a reel for winding a wire made of resin, and a motor or the like for driving and rotating the reel, one end of the wire being connected to an upper end of the third cylindrical member 1308, and the other end of the wire being wound by the reel.

As shown in FIG. 22, the other end of the second cylindrical member 1306 is bent toward the Y guide as viewed in a plan view. Accordingly, air can be drawn at a position spaced apart from the projection optical system 18 by elongating the third cylindrical member 1308.

A forward end of the third cylindrical member 1308 is cut in parallel to the XZ plane. Accordingly, a drawing port 1316 opening toward the HEPA filter 170 is formed. This arrangement is provided because of the following reason. Namely, air flows in the chamber 12 from the HEPA filter 170 to the projection optical system 18, and hence the drawing port 1316 is disposed downwind so that grime and so on floating in air is efficiently drawn together with air.

Figure 24:
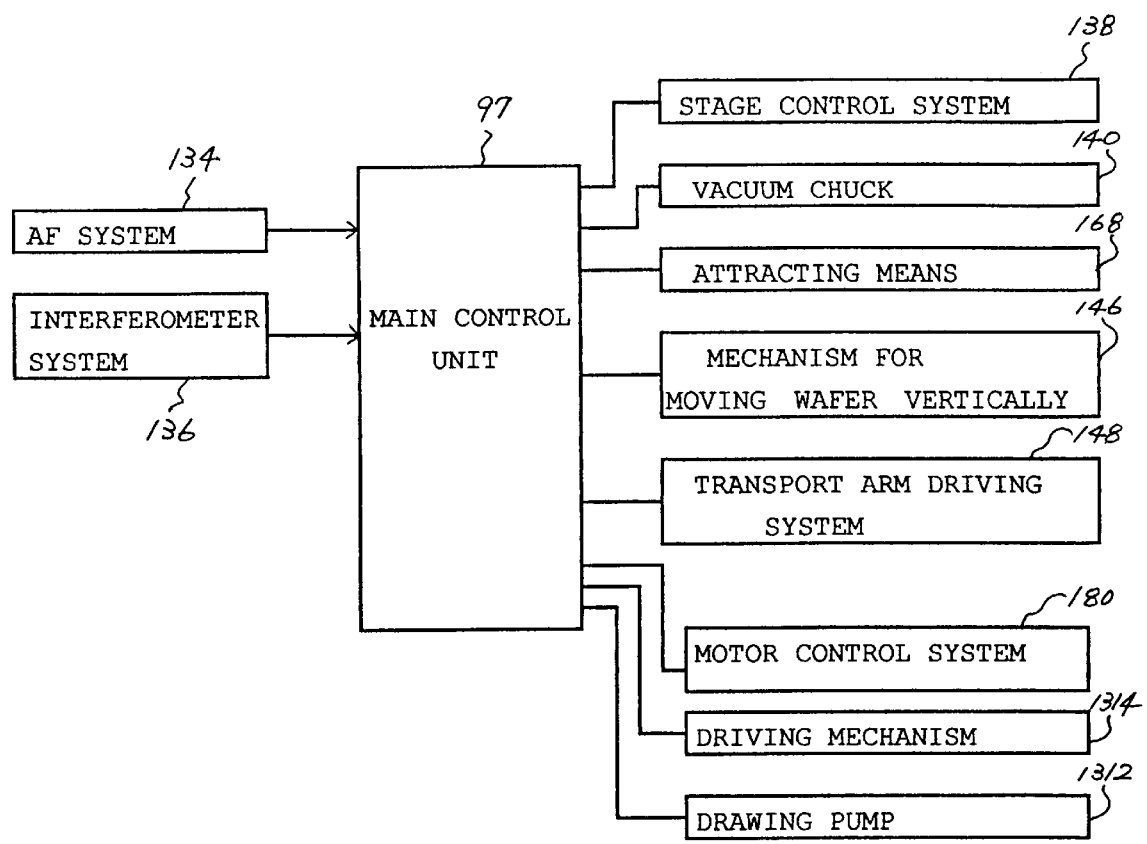
FIG. 24 shows a block diagram illustrating a schematic arrangement of a control system of the apparatus according the third embodiment in relation to holder cleaning.

Next, explanation will be made for a control system relating to cleaning for the holder which constitutes the exposure apparatus 1000 of this embodiment. As shown in FIG. 24, this control system is principally constituted by a main control unit 97 comprising a minicomputer or a microcomputer. An AF system 134 and an interferometer system 136 are connected to an input side of the main control unit 97. Connected to an output side of the main control unit 97 are a stage driving system 138, a vacuum chuck 140, an attracting means 168, a mechanism for vertically moving the wafer 146, a transport arm driving system 148, a motor control system 180, a driving mechanism 1314, and a suction pump 1312. In this embodiment, the stage driving system 138 comprises unillustrated feed screws, motors and so on for driving the X stage 42 and the Y stage 40 respectively. The stage driving system 138 drives the X stage two-dimensionally. The transport arm driving system 148 is provided at the Y guide 164 described above. The transport arm driving system 148 comprises a feed screw, a motor and so on (not shown) for driving the transport arm 166 along the Y guide 164.

Figure 25:
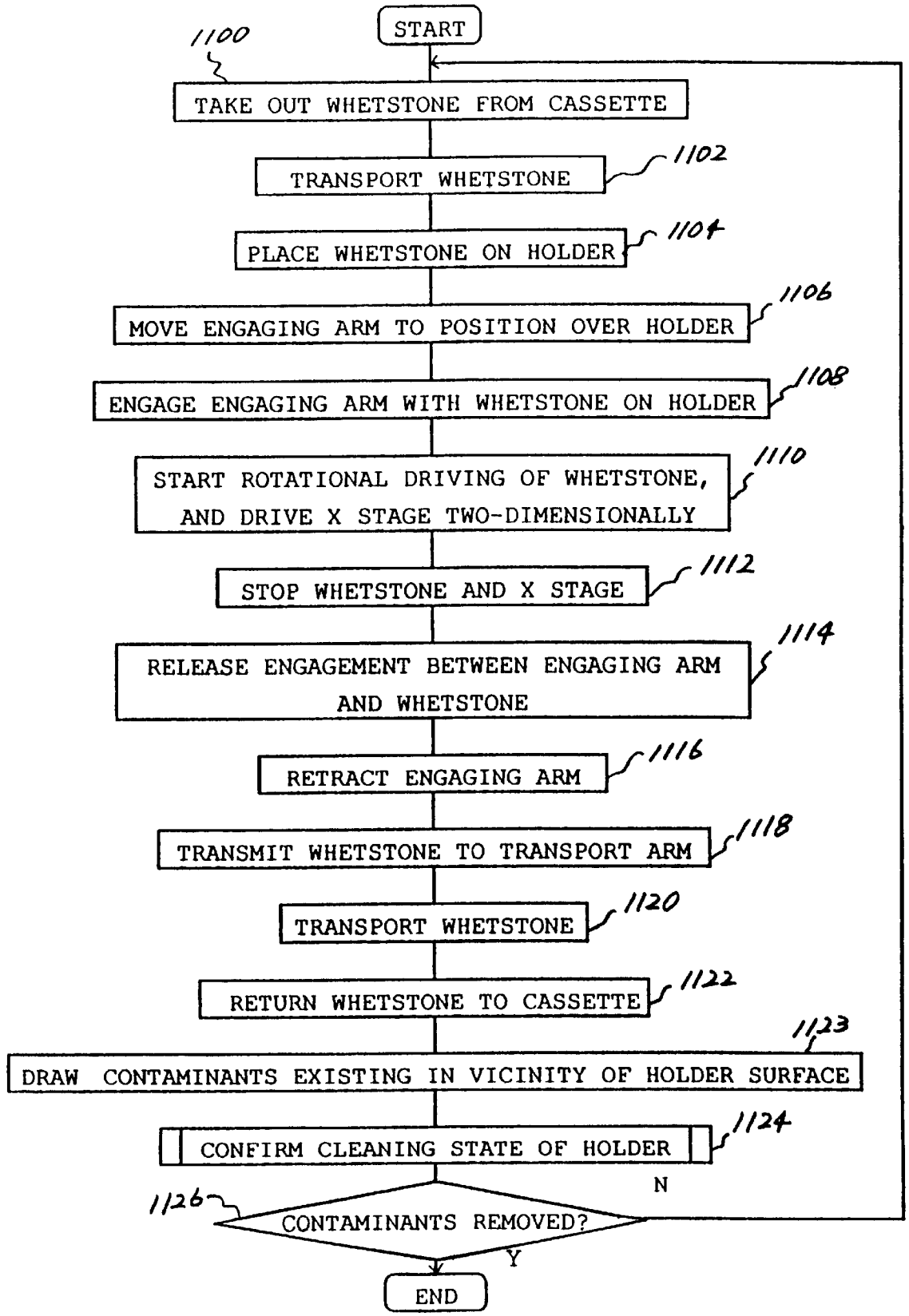
FIG. 25 shows a flow chart illustrating a principal control algorithm of a main control unit of the exposure apparatus according to the third embodiment.

Next, the holder cleaning process in this embodiment constructed as described above will be explained with reference to a flow chart in FIG. 25 which illustrates a principal control algorithm of the main control unit 97. This control algorithm comprises the control algorithm shown in FIG. 20, and it further comprises a step (step 1123) for drawing contaminants by the drawing device 1300 after cleaning the holder. At first, the operations of the steps 1100 to 1122 shown in FIG. 20 are performed in the same manner as the second embodiment. Contents of the operations are the same as those in the second embodiment, explanation of which is omitted.

After completion of the cleaning by the whetstone, the whetstone 196 is returned to the cassette in the step 1122. After that, in a step 1123, contaminants are drawn together with air in the vicinity of the holder. Specifically, the second and third cylindrical members 1306, 1308 are elongated in predetermined amounts through the driving mechanism 1314, and the drawing port 1316 is allowed to closely approach the surface of the holder 44. In this state, the suction pump 1312 is turned on to start drawing. During the drawing, the X stage 42 is moved two-dimensionally through the stage driving system 138 in the same manner as the cleaning by the whetstone 196. This operation is performed in order that the drawing port 1316 passes over the holder 44 and its vicinity inclusively without any omission because of the following reason. Namely, it is intended to reliably draw contaminants which enter the grooves of the holder 44 as well as contaminants which exist on portions other than the contact portion between the holder 44 and the wafer so that contaminants removed by the whetstone 196 do not re-adhere to the contact surface of the holder 44 to contact with the wafer. When the drawing port 1316 is allowed to closely approach the surface of the holder 44, if the height of the holder surface is always constant, it is enough to rotate the motor which constitutes the driving mechanism 1314 in a predetermined amount set previously. However, if the height of the holder surface is variable, it is necessary that the position of the drawing port 1316 is managed by using a photosensor, an encoder, etc. so that the drawing port 1316 does not contact with the holder 44.

When the cleaning for the holder by the whetstone 196 and the drawing device 1300 is completed as described above, the routine proceeds to the subroutine of "CONFIRM CLEANING STATE OF HOLDER" in the step 1124 in the same manner as shown in FIG. 21. Explanation for this subroutine has been made in the second embodiment, and hence it is omitted in this embodiment. After executing the processing in the subroutine, the subroutine returns to the step 1126 in the main routine. In the step 1126, it is judged whether or not contaminants are removed in the same manner as explained in FIG. 20. If the judgment in the step 1126 is negated, the routine returns to the step 100 to repeat the processing and the judgment as described above. On the other hand, if the judgment in the step 1126 is affirmed, the series of processing of this routine ends.

As explained above, according to this embodiment, gas such as air and nitrogen in the vicinity of the holder surface is drawn by the drawing means after the cleaning for the holder. Accordingly, contaminants floating in the air are drawn, and contaminants once removed can be prevented from re-adhesion to the contact surface of the holder 44 to contact with the wafer. Therefore, it is possible to avoid deterioration of overlay accuracy due to lateral fluctuation of the wafer caused by contaminants interposed between the holder 44 and the wafer 30. The drawing for contaminants by the drawing means may be simultaneously performed during the holder cleaning by the whetstone 196.

Figure 26:
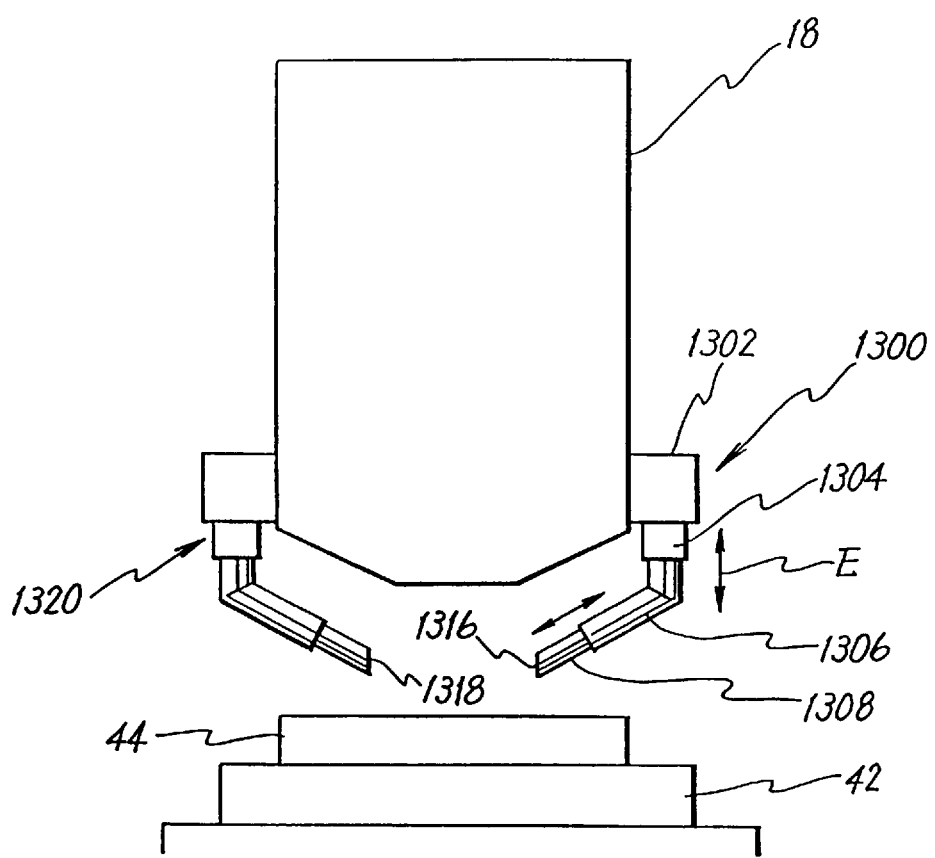
FIG. 26 shows principal parts of a modified embodiment of the exposure apparatus according to the third embodiment.

A modified embodiment of the third embodiment is shown in FIG. 26. As shown in FIG. 26, the exposure apparatus may further comprise a blowing device 1320 having a blowing port 1318 arranged to oppose to the drawing port 1316. Owing to this arrangement, when air is blown from the blowing port 1318 of the blowing device 1320 toward the surface of the holder 44, even if the holder surface has irregularities, contaminants adhered to the vicinity thereof are raised and floated in the air, which are drawn by the drawing device 1300 through the drawing port 1316 arranged to oppose to the blowing port 1318. Accordingly, it is possible to remove contaminants in the recessed grooves of the holder 44 more reliably.

In the first to third embodiments described above, examples have been explained in which the focal point detecting system is used to constitute the surface state measuring means. However, the present invention is not limited thereto. Instead of such an arrangement, the surface state measuring means may be constituted by using a leveling detecting system for detecting an inclination angle of each of measuring areas on a wafer by determining a divided area of a detector into which a reflected light beam from a wafer surface comes, as disclosed in U.S. Pat. No. 4,558,949. This document is incorporated herein by reference.

The exposure apparatus of the present invention has been explained in accordance with the embodiments described above. However, they are merely examples, and various modified embodiments thereof conceivable by those skilled in the art are also included in the scope of the present invention. The algorithms explained in the first to third embodiments are merely examples, which may be modified in various forms. In the second and third embodiments, the whetstone has been used as the cleaning member. However, the present invention is not limited thereto, and other members such as woven and nonwoven cloths may be also used as the cleaning member. The exposure apparatus of the present invention resides in a concept which encompasses reduction projection type exposure apparatuses of the slit scan system and the step-and-repeat system called stepper, as well as exposure apparatuses of various exposure systems including, for example, the mirror projection system, the proximity system, and the contact system.

As explained above, according to the present invention, it is possible to always maintain the substrate holder in a clean state without stopping the apparatus for a long period of time. Accordingly, an effect is obtained that the throughput can be improved while avoiding the decrease in yield of semiconductor devices and so on which would be caused by dirt on the substrate holder. The dirty holder is automatically washed by the washing unit. Accordingly, an effect is obtained that it is possible to avoid the difference among individuals caused by the conventional manual operation, and it is possible to avoid secondary contamination caused by the manual operation. Moreover, the substrate holder can be washed by the washing unit even after the exposure process is started after completion of exchange of the substrate holder. Accordingly, only by preparing at least two substrate holders, it is possible to always maintain the holder in a clean state without stopping the apparatus for a long period of time.

According to the present invention, contaminants on the substrate holding member are cleaned by driving and rotating the whetstone on the substrate holding member, and moving the state two-dimensionally during the rotation of the whetstone. Accordingly, even such contaminants difficult to be removed by the conventional techniques can be removed. The whetstone is placed on the substrate holding member only during the period of cleaning, and it is transported away by the transport system to the outside of the substrate holding member (for example, to the outside of the apparatus) during all periods other than the period of cleaning. Accordingly, it is possible to avoid secondary dust release which would be caused if the whetstone with grime adhered upon the cleaning is left to stand in the exposure apparatus. When the whetstone is stored at an external predetermined place during the period other than the period of cleaning, the whetstone can be exchanged without any stoppage of the apparatus at all. Therefore, an excellent effect, which has not been obtained by the conventional art, is obtained that the substrate holding member can be reliably cleaned over a long period of time without decreasing the throughput.

According to the present invention, contaminants on the substrate holding member can be removed approximately completely by rotating the whetstone on the substrate holding member. Moreover, contaminants once removed can be prevented from re-adhesion to the contact surface of the substrate holding member to contact with the substrate. Accordingly, an excellent effect, which has not been obtained by the conventional art, is obtained that it is possible to avoid deterioration of overlay accuracy due to lateral fluctuation of the substrate caused by contaminants interposed between the substrate holding member and the substrate.

The present invention may be practiced or embodied in other various forms without departing from the spirit or essential characteristics thereof. It will be understood that the scope of the present invention is indicated by the appended claims, and all variations and modifications which come within the equivalent range of the claims are embraced in the scope of the present invention.

What is claimed is:

1. An exposure apparatus for transferring a pattern formed on a mask onto a photosensitive substrate, comprising:
   a substrate holding member for holding the photosensitive substrate;
   a stage for detachably supporting the substrate holding member;
   an attaching/detaching mechanism for attaching and detaching the substrate holding member to and from the stage;
   a storing unit for storing the substrate holding member; and
   a transport system for receiving and transmitting the substrate holding member from and to each of the attaching/detaching mechanism and the storing unit, and transporting the substrate holding member between the attaching/detaching mechanism and the storing unit.

2. The exposure apparatus according to claim 1, wherein said transport system comprises a guide provided between the attaching/detaching mechanism and the storing unit, a mechanism for vertically moving and rotating the substrate holding member, and a mechanism for receiving and transmitting the substrate holding member from and to the attaching/detaching mechanism and the storing unit.

3. The exposure apparatus according to claim 2, wherein said mechanism for receiving and transmitting the substrate holding member is one of a transport arm and a robot hand comprising a substrate holding member grasping section which is movable along the guide and rotatable while grasping the substrate holding member.

4. The exposure apparatus according to claim 1, wherein said attaching/detaching mechanism comprises a support member for supporting the substrate holding member at its bottom surface, the support member being movable vertically through the stage, and a driving means for moving the support member.

5. An exposure apparatus for transferring a pattern formed on a mask onto a photosensitive substrate, comprising:
   a substrate holding member for holding the photosensitive substrate;
   a stage for detachably supporting the substrate holding member;
   an attaching/detaching mechanism for attaching and detaching the substrate holding member to and from the stage;
   a washing unit for washing the substrate holding member; and
   a transport system for receiving and transmitting the substrate holding member from and to each of the attaching/detaching mechanism and the washing unit, and transporting the substrate holding member between the attaching/detaching mechanism and the washing unit.

6. The exposure apparatus according to claim 5, wherein said transport system comprises a guide provided between the attaching/detaching mechanism and the washing unit, a mechanism for vertically moving and rotating the substrate holding member, and a mechanism for receiving and transmitting the substrate holding member from and to the attaching/detaching mechanism and the washing unit.

7. The exposure apparatus according to claim 6, wherein said mechanism for receiving and transmitting the substrate holding member is one of a transport arm and a robot hand comprising a substrate holding member grasping section which is movable along the guide and rotatable while grasping the substrate holding member.

8. The exposure apparatus according to claim 5, wherein said attaching/detaching mechanism comprises a support member for supporting the substrate holding member at its bottom surface, the support member being movable vertically through the stage, and a driving means for moving the support member.

9. An exposure apparatus for transferring a pattern formed on a mask onto a photosensitive substrate, comprising:
   a substrate holding member for holding the photosensitive substrate;
   a stage for detachably supporting the substrate holding member;
   an attaching/detaching mechanism for attaching and detaching the substrate holding member to and from the stage;
   a storing unit for storing the substrate holding member;
   a washing unit for washing the substrate holding member; and
   a transport system for receiving and transmitting the substrate holding member from and to each of the attaching/detaching mechanism, the storing unit, and the washing unit, and transporting the substrate holding member among the attaching/detaching mechanism, the storing unit, and the washing unit.

10. The exposure apparatus according to claim 9, wherein said transport system comprises a guide provided among the attaching/detaching mechanism, the storing unit, and the washing unit, a mechanism for vertically moving and rotating the substrate holding member, and a mechanism for receiving and transmitting the substrate holding member from and to the attaching/detaching mechanism, the washing unit, and the storing unit.

11. The exposure apparatus according to claim 10, wherein said mechanism for receiving and transmitting the substrate holding member is one of a transport arm and a robot hand comprising a substrate holding member grasping section which is movable along the guide and rotatable while grasping the substrate holding member.

12. The exposure apparatus according to claim 9, wherein said attaching/detaching mechanism comprises a support member for supporting the substrate holding member at its bottom surface, the support member being movable vertically through the stage, and a driving means for moving the support member.

13. An exposure apparatus for transferring a pattern formed on a mask onto a photosensitive substrate, comprising:
   a substrate stage for moving the photosensitive substrate two-dimensionally in a reference plane;
   a substrate holding member, placed on the substrate stage, for attracting and holding the photosensitive substrate; and
   a cleaning unit for cleaning the substrate holding member;
   said cleaning unit comprising:
      a transport system for transporting a cleaning member and receiving and transmitting the cleaning member from and to the substrate holding member;
      an engaging member for detachably engaging with the cleaning member on the substrate holding member;
      a rotary driving means for rotating the engaging member under engagement of the engaging member with the cleaning member; and
      a vertical movement means for moving the engaging member and the rotary driving means along a first direction perpendicular to a movement plane of the substrate stage.

14. The exposure apparatus according to claim 13, wherein said cleaning unit further comprises a horizontal movement means for allowing the engaging member and the rotary driving means to approach or leave the substrate stage by moving the engaging member and the rotary driving means along a second direction perpendicular to the first direction.

15. The exposure apparatus according to claim 13, further comprising a surface state measuring means for measuring surface irregularity or an inclination state of the substrate attracted and held on the substrate holding member.

16. The exposure apparatus according to claim 13, wherein the cleaning member has a groove provided on a surface opposite to a surface thereof contacting with the substrate holding member, said groove having a shape for allowing the engaging member to engage with the cleaning member by rotation of the engaging member.

17. The exposure apparatus according to claim 13, wherein said cleaning member has a surface contacting with the substrate holding member, said surface being formed of a porous material.

18. The exposure apparatus according to claim 13, wherein said cleaning member is formed of a whetstone.

19. The exposure apparatus according to claim 13, wherein said substrate holding member is cleaned by rotating the cleaning member on the substrate holding member while moving the substrate stage two-dimensionally.

20. The exposure apparatus according to claim 13, further comprising a gas drawing means for drawing gas existing in the vicinity of a surface of the substrate holding member.

21. An exposure apparatus for transferring a pattern formed on a mask onto a photosensitive substrate, comprising:

a substrate stage for moving the photosensitive substrate two-dimensionally in a reference plane;

a substrate holding member, placed on the substrate stage, for attracting and holding the photosensitive substrate;

a movement means for placing a cleaning member on the substrate holding member and retracting the cleaning member from the substrate holding member;

a cleaning means for cleaning the substrate holding member by rotating the cleaning member on the substrate holding member; and a gas drawing means for drawing gas existing in the vicinity of a surface of the substrate holding member.

22. The exposure apparatus according to claim 21, wherein said drawing means comprises a drawing port capable of approaching and leaving the substrate holding member on the substrate stage.

23. The exposure apparatus according to claim 21, further comprising a gas blowing means for blowing gas on the surface of the substrate holding member.

24. The exposure apparatus according to claim 21, wherein said substrate holding member is cleaned by rotating the cleaning member on the substrate holding member while moving the substrate stage two-dimensionally, and said gas existing in the vicinity of the surface of the substrate holding member is drawn by the gas drawing means while moving the substrate stage two-dimensionally.

* * * * *